(12) United States Patent
Aoki et al.

(10) Patent No.: US 6,207,591 B1
(45) Date of Patent: Mar. 27, 2001

(54) METHOD AND EQUIPMENT FOR MANUFACTURING SEMICONDUCTOR DEVICE

(75) Inventors: Nobutoshi Aoki; Ichiro Mizushima, both of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/190,444

(22) Filed: Nov. 13, 1998

(30) Foreign Application Priority Data

Nov. 14, 1997 (JP) .................................................. 9-329669

(51) Int. Cl.$^7$ ........................... H01L 21/26; H01L 21/42; H01L 21/324; H01L 21/477

(52) U.S. Cl. ........................... 438/795; 432/94; 438/799; 438/770; 438/775; 438/591

(58) Field of Search .................................... 438/795, 799, 438/591, 770, 775, 773, 776, 791, 792, 787, 788; 432/94

(56) References Cited

U.S. PATENT DOCUMENTS

| | | | |
|---|---|---|---|
| 4,432,809 | * | 2/1984 | Chye et al. ............................ 148/1.5 |
| 5,011,794 | * | 4/1991 | Grim et al. ............................ 437/247 |
| 5,478,765 | * | 12/1995 | Kwong et al. ......................... 437/40 |
| 5,880,009 | * | 3/1999 | Wang ..................................... 438/452 |
| 5,908,321 | * | 6/1999 | Lesk ..................................... 438/787 |

FOREIGN PATENT DOCUMENTS 3-116828   5/1991   (JP) .

OTHER PUBLICATIONS

S. Wolf, Silicon Processing for the VLSI Era, vol. 1: Process Technology; Lattice Press: Sunset Beach, CA, pp. 56–58, 1986.*

* cited by examiner

Primary Examiner—Charles Bowers
Assistant Examiner—Erik D Kielin
(74) Attorney, Agent, or Firm—Foley & Lardner

(57) ABSTRACT

A silicon wafer is heated from an initial pre-heating temperature ($T_0$) up to a first annealing temperature ($T_1$) by a rapid heating up step using an IR lamp. A first annealing is executed at the first annealing temperature ($T_1$). Successively, while the silicon wafer is maintained at a second annealing temperature ($T_2$) lower than the first annealing temperature ($T_1$), a second annealing step is executed by a resistive heating furnace. A thermal oxidation can be executed as the second annealing step. To do so, an equipment for manufacturing a semiconductor device in the present invention is provided with: a heating device having an IR lamp and a resistive heater; an annealing tube having on a surface thereof a plurality of concave portions in such a way that each bottom approaches a central line; a resistive heater wrapped around this annealing tube; and an IR lamp movably inserted into and pulled out from the concave portion from the external. A IR lamp moving unit for moving the IR lamp is connected to the IR lamp. A wafer loader for mounting a plurality of wafers can be carried into and from the annealing tube. The first annealing step using the IR lamp at the rapid heating rate and successively the second annealing step using the resistive heater are performed on the plurality of wafers without performing a cooling step down to the room temperature. Accordingly, it is possible to effectively recover the damage induced by ion implantation and the like and also possible to suppress the enhanced diffusion of impurity resulting from the,damage to thereby improve the controllability of impurity distribution profile.

26 Claims, 15 Drawing Sheets

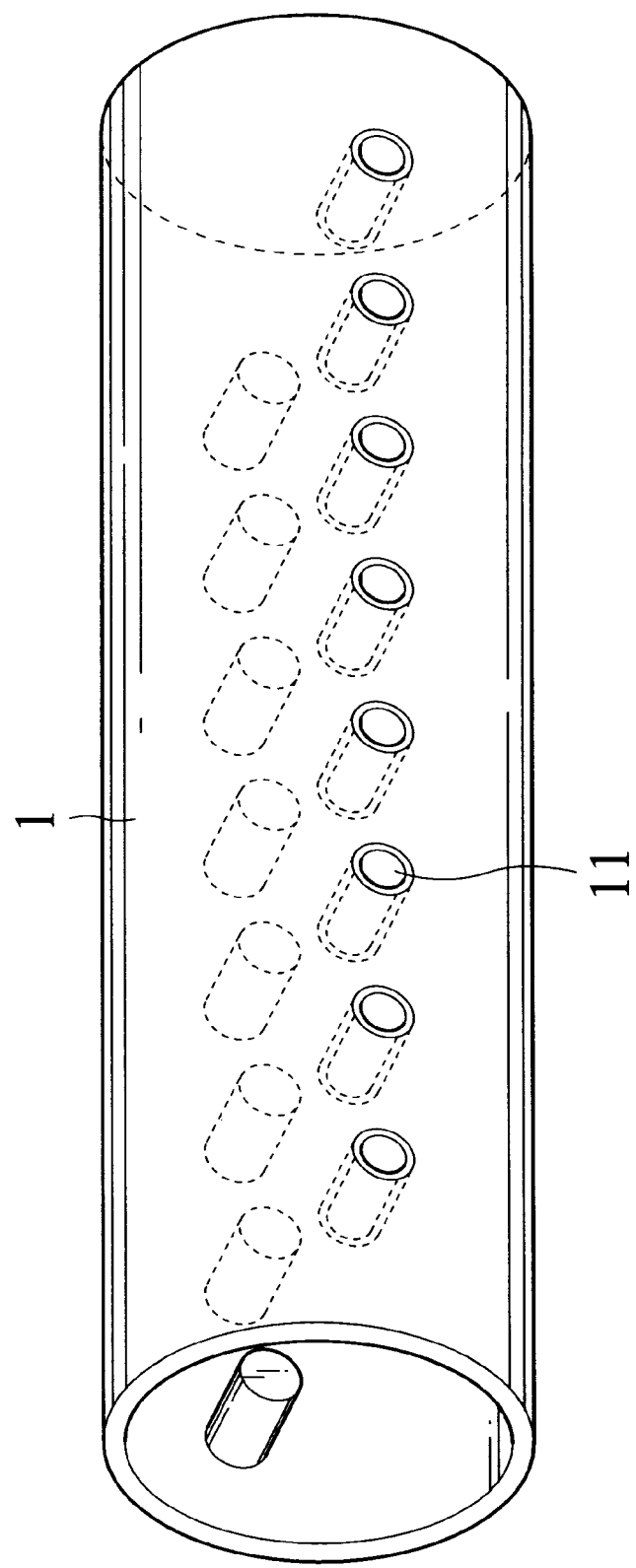

METHOD AND EQUIPMENT FOR MANUFACTURING SEMICONDUCTOR DEVICE

BACKGROUND OF THE INVENTION

1. Field of the Invention

The present invention relates to an annealing technology in a process for manufacturing a semiconductor device. More particularly, the present invention relates to a method for manufacturing a semiconductor device which can reduce the number of fabrication steps and then improve the controllability of impurity distribution profile and further accomplish the improved electrical characteristics, and a equipment for executing this method.

2. Description of the Related Art

A process for manufacturing a semiconductor device, such as an LSI and the like, is provided with a designing step, a mask preparing step, a wafer producing step, a wafer treatment step, an assembling step, an inspecting step and the like. The product is formed through these various steps. Among them, the wafer treatment step (hereafter, this is referred to as "a wafer process") is a main technique when the semiconductor device, such as the LSI and the like, is developed and manufactured. The wafer process is constituted by the complex combination of the various fabrication steps listed below:

(a) a film forming step, such as chemical vapor deposition (CVD), epitaxial growth, thermal oxidation and the like;

(b) a photolithography step;

(c) an etching step, such as wet etching, and dry etching including as reactive ion etching (RIE) and the like;

(d) an impurity doping step, such as thermal diffusion, ion implantation and the like;

(e) a planarizing step, such as chemical mechanical polishing(CMP) and the like; or (f) a wafer cleaning step.

Then, in order to attain the performance in accordance with the design of the objective semiconductor device, it is necessary to precisely control the vertical dimensions of thicknesses of various films and the like (the dimensions in the thickness direction), the lateral dimensions of gate lengths and the like (the dimensions in the plane direction), the impurity distribution profile and the like. However, a phenomenon is known in which the impurity diffusion is enhanced or suppressed by a damage (hereafter, referred to as "a primary defect") of a semiconductor substrate induced by the ion implantation used in the impurity doping step. Moreover, a fact is also known in which because of this damage, a defect (hereafter, referred to as "a secondary defect") such as a dislocation is induced by the next annealing and this defect causes the crystallographic deterioration, such as the increase of leakage current and the like. In order to recover the primary defect induced at the time of the ion implantation and the like, it is effective to execute a high temperature annealing by a rapid heating up step with an infrared (IR) lamp annealing or the like. Thus, a method of executing the IR lamp annealing after the ion implantation is conventionally used. Hence, in an actual wafer process, for example, after the ion implantation, several annealing steps are executed for the sake of the activation of the ion implantation as well as the recovery of the damage. After these fabrication steps, in the LSI technology, the thermally oxidizing step is executed to form a gate insulating film.

FIG. 1 shows a schematic view of a temperature history of a wafer when the thermally oxidizing step is executed by using a resistive heating furnace in accordance with a conventional technique. In FIG. 1, $T_2$ and $\tau_2$ denote a process temperature and a process time in the resistive heating furnace, respectively. In the case of the thermally oxidizing step, the $T_2$ is set to be a temperature region in a range between 700° C. and 1000° C., and the $\tau_2$ is set between several minutes and several hours. In the example shown in FIG. 1, a heating and cooling rate of the resistive heating furnace is assumed to be 50° C. per minute. However, there may be a case that the heating and cooling rate is stepwise changed depending on the temperature region of the heating and cooling operation. Moreover, a rate in a range between 1° C. per minute and 100° C. per minute is typical as the heating and cooling rate. However, there may be a case that the heating and cooling operation is executed at a faster speed or a slower speed than the above mentioned rate.

Conventionally, if the IR lamp annealing step is added for the sake of the activation of the implanted ion and the recovery of the damage after the ion implantation, a problem is brought about which drops a manufacturing efficiency of a product associated with the increase of the number of the annealing step. This problem is brought about by the troubles described below. That is, the frequency of raising and lowering the substrate temperature is increased in conjunction with the increase of the annealing step, which leads to the thermal fatigue of the semiconductor substrate resulting from the development of structural defect, the occurrence of micro defect such as oxygen precipitation and the like. As a result, the structural defect, the micro defect and the like cause the problem of the deterioration of the electric performance of the semiconductor device.

On the other hand, a method of consecutively executing the annealing step and the thermally oxidizing step by the rapid thermal annealing (RTA) operation with an IR lamp heating furnace may be considered as a promising scheme of avoiding the increase of the number of the annealing steps. Although the IR lamp heating furnace is advantageous to a locally heating operation, due to the nature of the IR lamp heating furnace, it is difficult to attain the uniform temperature distribution. Now, the utilization of a silicon wafer having a diameter of 300 mm is reviewed. In the annealing using such a large wafer, it is difficult to attain the uniformity of the temperature distribution, even if using a single wafer type IR lamp heating furnace.

Since the single wafer type IR lamp heating furnace has a problem of poor productivity, a batch type IR lamp heating furnace may be desirable which can process a plurality of silicon wafers at the same time. However, it is extremely difficult to attain the uniformity of the temperature distribution, if using the batch type heating furnace. Thus, if the plurality of silicon wafers are thermally oxidized at the same time by using the IR lamp heating furnace, this results in a problem that it is difficult to form an silicon oxide film having the uniform film thickness within the wafer surface. In particular, it is known that the oxidizing step executed in wet $O_2$ ambient is suitable for the formation of the silicon oxide film having the excellent quality such as a high breakdown voltage and the like. However, this has a problem that the accumulation of water drops on an inner wall of a reaction tube causes the irregularity of the transmission of the IR radiation. Moreover, this causes a trouble that it is difficult to form the silicon oxide film having the uniform film thickness within the wafer surface.

As mentioned above, it is difficult to simultaneously execute the recovery of the damage and the formation of the excellent and uniform silicon oxide film by only using the IR lamp heating furnace. It is especially difficult to simultaneously execute the recovery of the damage and the formation of the excellent silicon oxide film, for the plurality of large diameter silicon wafers. This results in a problem of a poor throughput.

SUMMARY OF THE INVENTION

The present invention is proposed in view of the above mentioned circumstances. It is therefore an object of the present invention to provide a method for manufacturing a semiconductor device, which effectively recovers the damage induced by the ion implantation and the like and then suppresses the enhanced diffusion of the impurity resulting from the damage and thereby improves the controllability of the impurity distribution profile and also have the excellent properties such as electrical characteristic and the like and further does not increase the number of fabrication steps as compared with the conventional methods.

Another object of the present invention is to provide an equipment for manufacturing a semiconductor device, which can perform an annealing on a plurality of wafers at a single operation in the condition of a high temperature and a rapid heating rate by using an IR lamp and successively perform an annealing by using a resistive heater without performing a cooling step on the wafers.

From the viewpoint of the above mentioned objects, the first feature of present invention lies in a method for manufacturing a semiconductor device, which at least comprises the steps of: heating a semiconductor substrate from an initial temperature up to a first annealing temperature at a first heating rate and then maintaining this temperature for a predetermined period and thereby performing a first annealing on the semiconductor substrate; decreasing temperature of the semiconductor substrate from the first annealing temperature to a second annealing temperature, which is higher than the initial temperature and lower than the first annealing temperature, at a first cooling rate; maintaining the second annealing temperature for a predetermined period and thereby performing a second annealing on the semiconductor substrate; and cooling the semiconductor substrate at a second cooling rate down to the initial temperature.

According to the first feature of the present invention, the sequence of steps comprising the first annealing step at the first annealing temperature with the high temperature and the second annealing step at the second annealing temperature following it can be executed as a single fabrication step, without including the cooling of the wafer down to the room temperature. As a result, according to the first feature of the present invention, the number of fabrication steps is never increased. Moreover, there is no fear of generation of the crystal defects resulting from the increase of the annealing step. The IR lamp heating operation is desirable in order to heat at a rapid heating rate to the required first annealing temperature and to anneal the wafers with the high first annealing temperature. If the resistive heater is used in the second annealing at the second annealing temperature, it is easy and desirable to attain the uniformity of the temperature distribution. According to the first feature of the present invention, it is not necessary to provide the step of cooling the wafer to a temperature equal to or lower than 500° C. between the first annealing step and the second annealing step following it. Thus, it is possible to effectively recover the damage induced by the ion implantation and the like and also possible to suppress the enhanced diffusion of the impurity resulting from the damage to thereby improve the controllability of the impurity distribution profile. As a result, a semiconductor product having a high quality such as an improved electric performance and the like can be manufactured without increasing the number of fabrication steps. Moreover, a large number of wafers can be simultaneously processed by the annealing equipment for mass producing semiconductor devices in the present invention. Thus, it has the high throughput and the excellent productivity.

The second feature of the present invention lies in a method of manufacturing a semiconductor device, which at least comprises the steps of: heating a semiconductor substrate from an initial temperature up to a first annealing temperature at a first heating rate and then maintaining this temperature for a predetermined period and thereby performing a first annealing on the semiconductor substrate; decreasing temperature of the semiconductor substrate from the first annealing temperature to a second annealing temperature, which is higher than the initial temperature and lower than the first annealing temperature, at a first cooling rate; maintaining the second annealing temperature for a predetermined period and thereby performing a second annealing on the semiconductor substrate; heating the semiconductor substrate up to a third annealing temperature higher than the second annealing temperature at a second heating rate and then maintaining this temperature for a predetermined period and thereby performing a third annealing on the semiconductor substrate; and cooling the annealed semiconductor substrate at a second cooling rate down to the initial temperature.

According to the second feature of the present invention, the first annealing step at the first annealing temperature with the high temperature, the second annealing step at the second annealing temperature following it and the third annealing step further following it can be executed as a single fabrication step without the step of cooling the wafer down to the room temperature. Especially, if the second annealing step includes the oxidizing step, it is possible to improve the film quality of the silicon oxide film formed at this oxidizing step by the third annealing step. Recently, a gate length of the MOSFET used for the LSI is scaled down to a sub-quarter micron level. The film thickness of the gate insulating film of the MOSFET having such a miniaturized structure tends to become thinner and thinner. Such a formation of the extremely thin silicon oxide film requires that the oxidation temperature must becomes lower and lower. However, a structural stress, such as the distortion remaining in a coupling network of a silicon atom and an oxygen atom, remains in the film oxidized at lower temperatures. This deteriorates the reliability of the silicon oxide film with regard to the breakdown voltage, the dielectric breakdown and the like. Such a stress induced in the silicon oxide film can be effectively relaxed by the third annealing step at the third annealing temperature.

The IR lamp heating operation is desirable in order to heat at a rapid heating rate to the first and third annealing temperatures designed with the higher temperatures. If the resistive heater is used in the second annealing at the second annealing temperature, it is easy and desirable to attain the uniformity of the temperature distribution. According to the second feature of the present invention, it is not necessary to provide the step of cooling the wafer to a temperature equal to or lower than 500° C. between a sequence of steps composed of the first annealing step, the second annealing step and the third annealing step. Thus, the number of fabrication steps for semiconductor device is never increased. It is possible to effectively recover the damage induced by the ion implantation and the like and also possible to suppress the enhanced diffusion of the impurity resulting from the damage to thereby improve the controllability of the impurity distribution profile. As a result, a semiconductor product having a high quality such as an excellent electric performance and the like can be manufactured without increasing the number of fabrication steps.

The third feature of the present invention lies in an equipment for manufacturing a semiconductor device, which at least comprises: an annealing tube for transmitting a light having a predetermined wavelength; a resistive heater positioned adjacently to the annealing tube; an IR lamp positioned adjacently to and movable to the annealing tube; and an IR lamp moving unit for moving the IR lamp.

As described in the first and second features of the present invention, the IR lamp heating operation is desirable in order to heat at the rapid heating rate to the first annealing temperature, and the resistive heater may be used in order to execute the second annealing with the excellent temperature uniformity at the second annealing temperature. Thus, according to the equipment for manufacturing a semiconductor device, which has the third feature of the present invention, it is possible to use the same annealing tube to execute the first annealing step at the first annealing temperature with the high temperature and the second annealing step at the second annealing temperature following it, as the single fabrication step, without the step of cooling the wafer to the room temperature.

In the equipment for manufacturing a semiconductor device according to the third feature of the present invention, the IR lamps are adapted so as to be moved to the annealing tube by using the IR lamp moving unit. Thus, there is no fear that the resistive heater causes the IR lamps to be burned and also causes the life to be shortened. Moreover, it is easy to accomplish the configuration of simultaneously processing the large number of wafers in a batch processing. Hence, it is possible to provide the equipment for mass producing semiconductor devices, which has the high throughput, the high manufacturing yield and the excellent productivity. Preferably, the annealing tube is constituted by the high purity quartz transmitting the IR light. The resistive heater may have the configuration that, for example, it is wrapped around the annealing tube at lest a few turns in a form of a coil and further a plurality of concave portions are disposed at the wall of the tube arranged between the turns of the coil. Such a configuration enables the plurality of IR lamps to be movably inserted into and pulled out from the concave portions. Or, the resistive heater may have the configuration that it runs along the axial direction of the high purity quartz with zigzag manner. Further, a plurality of bar type resistive heaters which run along the axial direction of the high purity quartz can be employable. If the concave portions are implemented such that bottoms thereof approach the vicinity of the axial line of the annealing tube, the IR lamps can be located closely to the batch of semiconductor substrates. Therefore, the batch of semiconductor substrates can be heated further effectively. Any shape of the concave portion is employable such as cylindrical, rectangular or groove in a stripe form, as long as the IR lamp can be movably inserted into it.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 2B is a perspective view (bird's eye view) of an annealing tube employed in the equipment shown in FIG. 2A;

DETAILED DESCRIPTION OF THE INVENTION

Figure 1:
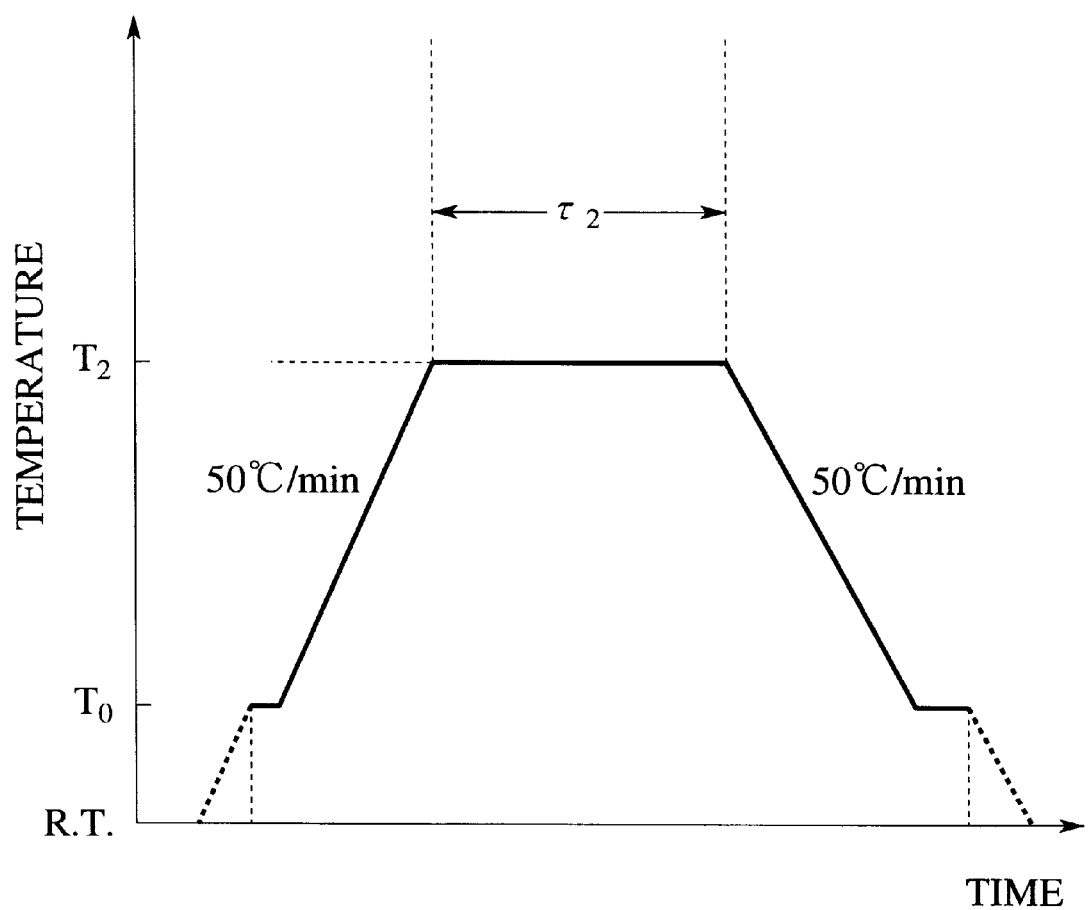
FIG. 1 is a schematic view showing a time dependency of a temperature within a resistive heating furnace in a conventional annealing step.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

EQUIPMENT

Figure 2A:
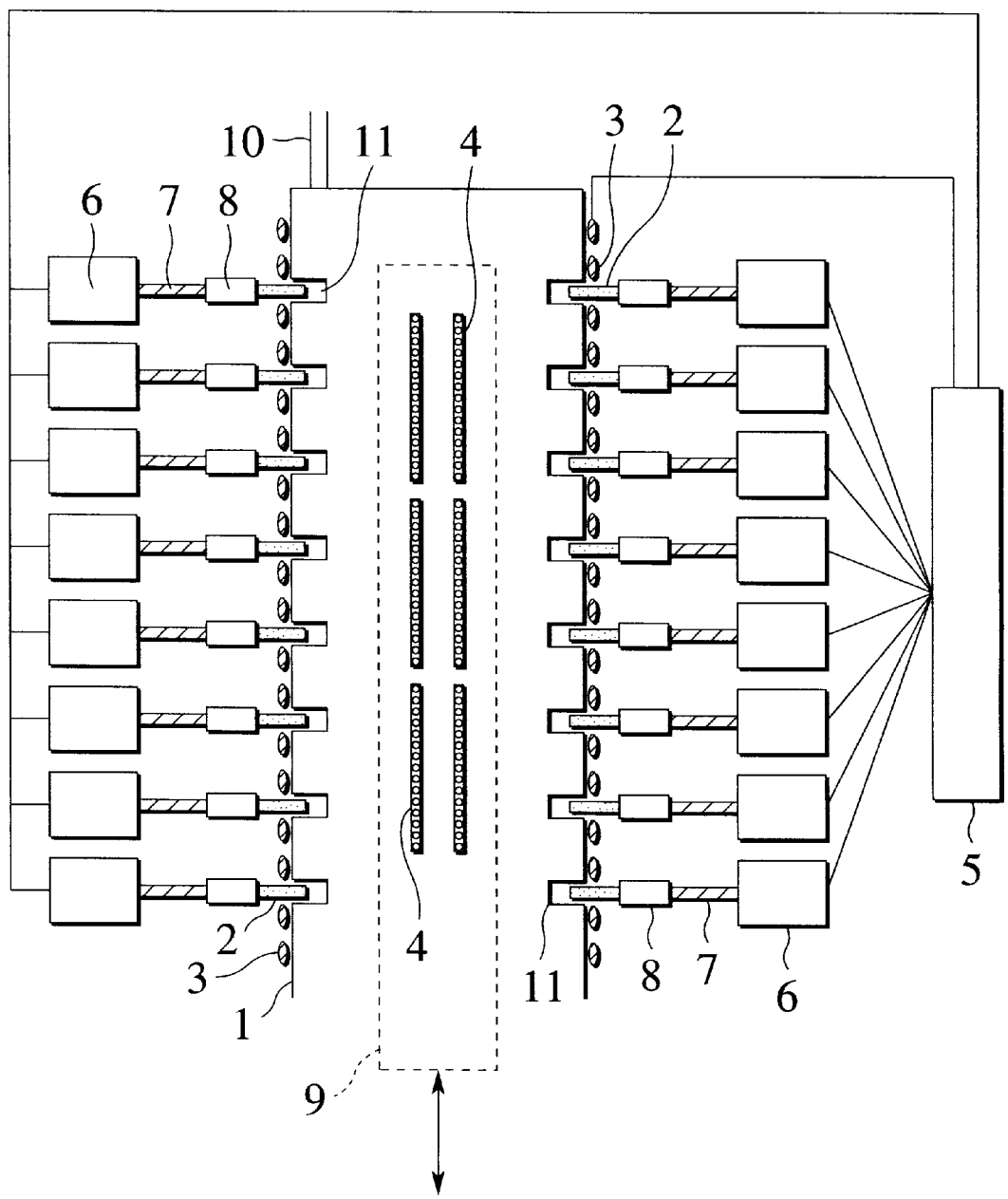
FIG. 2A is a sectional view of an equipment for manufacturing a semiconductor device in the present invention.

FIG. 2A is a sectional view of an equipment for manufacturing a semiconductor device in the present invention.

FIG. 2B is a perspective view of an annealing tube used in the equipment shown in FIG. 2A.

The equipment for manufacturing a semiconductor device in the present invention is constituted by a system comprising the annealing tube 1 made of the high purity quartz tube for transmitting a light (an IR radiation) having a predetermined wavelength; a resistive heater 3 positioned adjacently to the annealing tube 1; a plurality of IR lamps 2, each emitting the light having the predetermined wavelength, each movable to the annealing tube; an IR lamp moving unit 6 for moving the IR lamps 2, as shown in FIG. 2A. The IR lamp 2 is made of a tungsten IR lamp, a halogen IR lamp or the like. The resistive heater (heating wire) 3 is made of a heating wire in which refractory metal silicide such as $MoSi_2$ and the like is used. The heating wire 3 is wrapped around the high purity quartz tube 1 serving as the annealing tube at lest a few turns in a form of a coil. As shown in FIG. 2A, a plurality of cylindrical concave portions 11 are disposed on the side wall of the high purity quartz tube 1. Each cylindrical concave portion 11 has an inner diameter slightly thicker than the external diameter of the IR lamps 2 and has a depth substantially equal to that of the light emitting portion of the IR lamps 2. Supporting bars 7 are inserted into sockets 8 of the IR lamps 2, respectively. The IR lamp moving unit 6 attached to the supporting bars 7 drives the action of inserting and plucking the IR lamps 2 so that these IR lamps 2 can be inserted into and plucked out from the cylindrical concave portions 11, respectively. A controller 5 executes the action of inserting and plucking the IR lamps 2, as well as the output power control of the IR lamps 2 and the output power control of the resistive heater 3. FIG. 2A shows the heating furnace in which a total of 16 IR lamps are mounted. However, the number of IR lamps can be determined depending upon the annealing conditions such as the annealing temperature, the diameter of the objective wafer 4, the number of objective wafers 4 in a batch and the rated output power of the IR lamp. Although in this embodiment the IR lamp moving unit 6 is adapted so as to individually control the movements of the respective IR lamps 2, the action of inserting and plucking the IR lamps 2 can be controlled by a single IR lamp moving unit 6, for example, by collecting the plurality of IR lamps 2 on a single supporting bar.

A gas introduction pipe 10 is attached to the top of the high purity quartz tube 1. This gas introduction pipe 10 introduces non-oxidative gas and/or oxidative gas into the high purity quartz tube 1. In FIG. 2A, the introduction tube 10 is exemplary shown as a single tube. However, a plurality of introduction tubes may be attached depending on the kinds of gases and the purposes of the gas introductions.

A wafer loader 9 on which a batch of wafers 4 are mounted is so constituted that it can be inserted into and pulled out from the inside of the high purity quartz tube 1. FIG. 2A exemplifies the case in which the batch consisting of three pairs of wafers 4 are arranged respectively in double lanes grooved on the surface of the wafer loader 9 in parallel, the bottom surfaces of each pair of wafer 4 facing to each other, and a total of six wafers 4 can be processed at a single batch operation. However, it is possible to decrease the number of objective wafers by disposing the IR lamp only on one side facing to the top surface of wafers arranged on one of the double lanes and processing only the batch of wafers 4 arranged on the selected single lane. Moreover, it is possible to adjust the number of IR lamps, the length of the high purity quartz tube 1 and the like to thereby increase or decrease the number of wafers 4 that can be processed at a single batch operation.

The operations of the heating furnace shown in FIGS. 2A and 2B will be described below with reference to FIG. 3. The abscissas of FIG. 3 indicate the annealing times of the annealing step in the present invention, and then time points $t_1$ to $t_6$ respectively imply the predetermined treatment times. FIG. 3(a) is a schematic view showing the time dependency of the wafer temperature in the annealing step. FIG. 3(b) is a schematic view showing the respective time dependencies of the outputs of the IR lamp and the resistive heater to accomplish the temperature variation shown in FIG. 3(a). FIG. 3(c) is a schematic view showing the switching operation between various ambient gases, in response to the schematic view of FIG. 3(b). Here, the ordinate of FIG. 3(a) indicates the wafer temperatures (° C.), and an origin thereof indicates a room temperature. The temperature indicated in FIG. 3(a) includes an initial temperature $T_0$, a first annealing temperature $T_1$, a second annealing temperature $T_2$ and the like. The initial temperature $T_0$ is a preheating temperature of the heating furnace shown in FIGS. 2A and 2B, and represents a temperature when the batch of wafers 4 are carried into and from the high purity quartz tube 1.

Now, a sequence of the process is explained, in which the rapid thermal annealing (RTA), or the first annealing is executed at a high temperature of 1000° C. ($T_1$) in a short time, the second annealing, or the oxidizing step is executed at 700° C. ($T_2$) in the wet $O_2$ ambient for 60 minutes, and then the batch of wafers 4 are cooled down to the initial temperature $T_0$ at which the wafers 4 are carried from the wafer loader 9.

(a) At first, an output power of the resistive heater 3 is adjusted such that a temperature of the high purity quartz tube 1 serving as the annealing tube is kept at the initial temperature (the preheating temperature) $T_0$=500° C. A preheating temperature can be set to any other temperatures. It is desired that this preheating temperature $T_0$ is equal to or lower than 600° C. in order to suppress an extra impurity diffusion, which would be inevitably caused during the batch of wafers 4 are loaded into the annealing tube. However, it is necessary that the preheating temperature $T_0$ is equal to or higher than 500° C. because the other disadvantages, such as an increase of the heating time to attain the required annealing temperature, would be brought about if the preheating temperature $T_0$ is extremely low. Namely, it would be allowable that the high purity quartz tube 1 is kept at the room temperature, without executing the preheating operation, in a special case. However, it is desirable that the high purity quartz tube 1 is preheated to approximately 500 to 600° C. by considering the heating rate and the heating efficiency when the batch of wafers 4 are supposed to be heated to very high temperatures such as 1000° C., as mentioned above. After the batch of wafers 4 are placed on the wafer loader 9, the wafer loader 9 is carried into the high purity quartz tube 1. For example, a silicon wafer having a diameter of 8 inches to 12 inches can be used for the wafer 4. At this time, the IR lamps 2 shown in FIG. 2B are moved toward the cylindrical concave portions 11 while the batch of wafers 4 are carried, in such a way that finally the IR lamps 2 are inserted and fixed into the respective cylindrical concave portions 11 of the high purity quartz tube 1. This movement of the IR lamps 2 into the respective cylindrical concave portions 11 may be executed before the batch of wafers 4 are carried into the high purity quartz tube 1, or after the wafers 4 are completely carried into the high purity quartz tube 1.

(b) After the batch of wafers 4 are carried into the high purity quartz tube 1, the output power of the IR lamps 2 is made higher. The wafer is heated at a heating rate of 100° C. per second until the temperature of the wafer becomes the first annealing temperature $T_1=1000°$ C. At this time, the temperature of the wafer is measured by using a thermocouple, a pyrometer (a radiation energy sensor) or the like. The measured result is inputted to the controller 5. The output power of the IR lamp may be adjusted by a proportional plus integral plus derivative (PID) controller and the like while the feedback signal is being applied to a power supply which provide the input voltage for the IR lamps 2. Or, it is allowable to employ a method of obtaining in advance the data with regard to a relationship between the output power of the IR lamps 2 and the temperature of the batch of wafers 4 to thereby control the output power of the IR lamps 2 in accordance of a program control methodology based on this data. In FIG. 3, the heating rate is assumed to be 100° C. per second. However, the heating rate can be freely set. Although the heating operation is executed until 1000° C., it is also possible to freely set this temperature. However, in order to effectively recover the damage resulting from the ion implantation, it is desirable that the maximum heating rate is equal to or higher than 10° C. per second and the $T_1$ is equal to or higher than 950° C.

(c) After the temperature of the batch of wafers 4 reaches the first annealing temperature $T_1$ (1000° C.), this temperature is maintained, for example, for 10 seconds. Then, a first annealing step is executed. It is possible to freely set a period from the time point $t_2$ to the time point $t_3$ at this temperature $T_1$, namely, the retention period of the first annealing step.

However, it is desirable that this retention time is set between several seconds and several minutes. In a special case, the retention time may be zero. That is, the cooling operation may be executed immediately after the temperature of the batch of wafers 4 reaches the first annealing temperature $T_1$.

(d) After the first annealing temperature $T_1$ is maintained for 10 seconds, the output power of the IR lamps 2 is made lower. Moreover, each IR lamp 2 begins to be gradually pulled out from the cylindrical concave portion 11 of the high purity quartz tube 1. Simultaneously, as shown in FIG. 3(b), the output power of the resistive heater 3 is made higher, and the cooling rate is set to 50° C. per second, and then the cooling operation is executed until the temperature of the wafer becomes the second annealing temperature $T_2=700°$ C. As shown in FIG. 3(a) and (b), the cooling rate of the batch of wafers 4 are lower than the drop of the output power of the IR lamps 2, ascribable to a relatively large heat capacitance of the IR lamps 2, the high purity quartz tube 1 and wafers 4 themselves. The cooling rate from the first annealing temperature $T_1$ to the second annealing temperature $T_2$ can be freely set by controlling the output power of the IR lamps 2 and the resistive heater 3. However, in order to shallowly suppress the diffusion depth of the impurity in the wafers, it is desirable that the maximum cooling rate is equal to or higher than 10° C. per second. It is allowable to simultaneously reduce the output power of the IR lamps 2 and pull the IR lamps 2 from the respective cylindrical concave portions 11, or the output power of the IR lamps 2 may be reduced after the IR lamps 2 are pulled out. Moreover, the IR lamps 2 may be pulled out after output power of the IR lamps 2 is properly reduced. However, since the IR lamps 2 are set to approach the vicinity of the wafer 4 by means of the cylindrical concave portion in order to effectively increase the temperature of the wafers 4, the uniformity of the surface temperature within each wafer 4 and that between the wafers 4 may be deteriorated in conjunction with the drop of the output power of the IR lamps 2. Thus, in this case, it is effective to quickly switch to the heating by the resistive heater 3. To do so, it is desirable to simultaneously reduce the output power of the IR lamps 2 and pull out the IR lamps 2 to keep a distance from the high purity quartz tube 1. Moreover, if the peripheral parts of the IR lamps 2, such as the sockets 8 and the like, are set to be located closely to the resistive heater 3, it is preferable to quickly pull out the IR lamps 2, thereby avoiding the trouble, such as the scorching or burning of the sockets 8 associated with the temperature rise of the resistive heater 3. Incidentally, the second annealing temperature $T_2$ can be set to any temperature equal to or lower than the first annealing temperature $T_1$. Moreover, the cooling rate can be freely set. Here, the output power of the resistive heater 3 is made larger from the start time point $t_3$ of the cooling operation from the first annealing temperature $T_1=1000°$ C. However, the output power of the resistive heater 3 may be increased from the beginning (time point $t_1$) of the original heating operation up to the first annealing temperature $T_1=1000°$ C., or the output power of the resistive heater 3 may be increased after the time point (time point $t_3$) of the beginning of the cooling operation from the first annealing temperature $T_1=1000°$ C.

(e) After the temperature reaches the second annealing temperature $T_2=700°$ C. (time point $t_4$), the oxidizing operation of the surface of the wafers 4 are carried out, for example, with the wet $O_2$ ambient as the second annealing step. In the case of the wet $O_2$ ambient, the water vapor generated by hydrogen ($H_2$) burning, or the $O_2$ gas bubbling through the ultra high purity deionized water is introduced from the gas introduction pipe 10 into the high purity quartz tube 1. Incidentally, argon (Ar) gas is used as the ambient between the time point (for example, the time before $t_1$) of carrying the batch of wafers 4 into the high purity quartz tube 1 and the time point $t_4$ as shown in FIG. 3(c). However, any atmosphere may be used as the ambient until the time point $t_4$, depending on the object of the heat treatment against the wafers 4. Especially, it is preferable to employ the $H_2$ gas as the ambient between the time point ($t \leq t_1$) of carrying the batch of wafers 4 into the high purity quartz tube 1 and the time point $t_4$, since it enables the surface of the wafer to be cleaned and smoothed. Any atmosphere other than these can be freely set as the ambient between the time point ($t \leq t_1$) of carrying the wafer 4 into the high purity quartz tube 1 and the time point $t_4$. Oxidative nitric atmosphere, such as nitrogen ($N_2$) gas, nitrogen monoxide (NO) gas, nitrogen dioxide ($NO_2$) gas and the like may be used. Moreover, it is possible to use $O_2$ gas diluted with $N_2$ gas, $H_2$ gas diluted with Ar gas and the like. And, it is also possible to pour hydrochloric acid (HCl) diluted with $N_2$ gas and Ar gas to thereby clean the surface of substrate. The second annealing step at the second annealing temperature $T_2$ may be the oxidizing operation in dry $O_2$ ambient in which $O_2$ gas diluted with $N_2$ gas, Ar gas, helium (He) gas and the like is used, or the oxidizing operation in oxidative ambient including diluted HCl. While the temperature is maintained at 700° C. from the time point $t_4$, the oxidizing operation is executed until the time point $t_5$ for 60 minutes. However, the treatment period from the time point $t_4$ to the time point $t_5$ may be freely set on the basis of the requirement of the silicon oxide film thickness.

(f) After the oxidizing step for 60 minutes is ended as the second annealing step at the second annealing temperature $T_2$, the ambient is switched from the wet $O_2$ ambient to the Ar gas atmosphere as shown in FIG. 3(c), and then the output power of the resistive heater 3 is reduced as shown in FIG. 3(b). Accordingly, the batch of wafer 4 are cooled down to the initial temperature $T_0=600°$ C. at a cooling rate of 50° C. per minute. It is possible to freely set the ambient gas in the cooling operation from the time point $t_5$ to the time point $t_6$. The oxidative nitric atmosphere, such as the $N_2$ gas, the NO gas, the $NO_2$ gas and the like may be used. Moreover, the $O_2$ gas diluted with the $N_2$ gas, the $H_2$ gas diluted with the Ar gas and the like may be used. After the batch of wafer 4 are cooled down to the initial temperature $T_0=600°$ C., the wafer loader 9 is carried from the high purity quartz tube 1. Accordingly, the batch of wafers 4 are taken out. Then, the process is ended. The cooling rate from the time point $t_5$ to the time point $t_6$ can be freely set by adjusting the output of the heater. However, the extremely rapid cooling operation causes the stress to be induced in the wafers 4 and also leads to the defect within the wafers 4. Thus, it is desirable that the maximum cooling rate is equal to or lower than 500° C. per minute. If the cooling rate is made slower, the extra impurity diffusion may exert bad effect on the objective impurity profile. Hence, it is preferable that the maximum cooling rate is equal to or higher than 10° C. per minute. Under these conditions, the cooling rate from the second annealing temperature $T_2$ to the initial temperature $T_0$ can be freely set.

As mentioned above, the annealing equipment in the present invention can use the same furnace, without once returning back to the room temperature, and successively execute the IR lamp annealing step at the first annealing temperature $T_1$ and the oxidizing step at the second annealing temperature by using the resistive heater. Moreover, according to the annealing equipment in the present invention, the recovery of the damage and the formation of the silicon oxide film having the uniform thickness can be accomplished by performing a sequence of annealing steps composed of the RTA step by the IR lamps and the oxidizing step using the resistive heater, against to the plurality of wafers 4, at a single batch operation. Furthermore, the productivity is excellent because the annealing step with the high uniformity can be performed on the plurality of wafers 4 at the single batch operation.

The equipment for manufacturing a semiconductor device in the present invention is not limited to the structure shown in FIGS. 2A and 2B. For example, the structure shown in FIGS. 4A to 4C or FIGS. 5A to 5C can be employed.

Figure 4A:
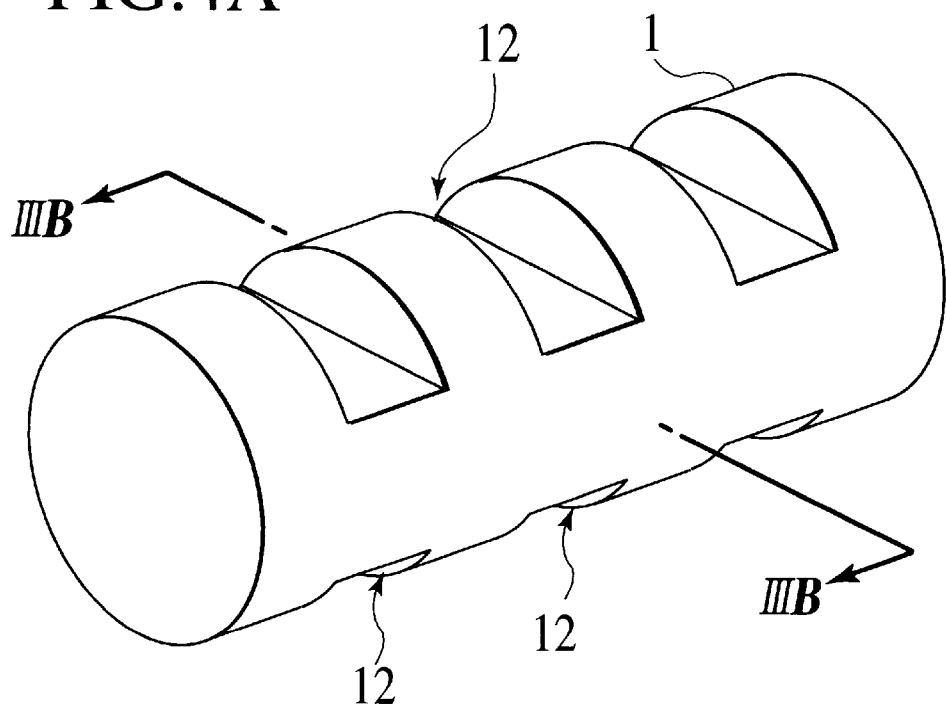
FIG. 4A is a perspective view (bird's eye view) of another annealing tube according to the equipment for manufacturing a semiconductor device in the present invention.
Figure 4B:
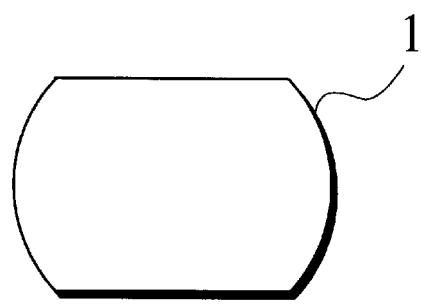
FIG. 4B is a sectional view taken on the line III B—III B of the annealing tube shown in FIG. 4A.

FIG. 4A is a perspective view of another annealing tube used in the equipment for manufacturing a semiconductor device in the present invention. FIG. 4B is a sectional view taken on the line III B—III B of the annealing tube shown in FIG. 4A. In FIG. 4A, a plurality of grooves 12 vertical to an axial direction of the annealing tube 1 are disposed instead of the cylindrical concave portions 11 shown in FIGS. 2A and 2B. The bottoms of the grooves 12 may have the flat surfaces as shown in FIG. 4B. A plurality of IR lamps may be respectively inserted into or pulled out from the respective grooves 12 dented vertical to the axial direction of the annealing tube 1, by using the IR lamp moving unit. The IR lamp may be made of the cylindrical type IR lamp having the axial direction arranged along the radius direction of the annealing tube, similarly to that of FIG. 2A. Or the cylindrical type IR lamp may have the axial direction arranged vertical to the axis of the annealing tube 1 so that the horizontally arranged IR lamp may be driven up and down along the vertical direction.

Figure 4C:
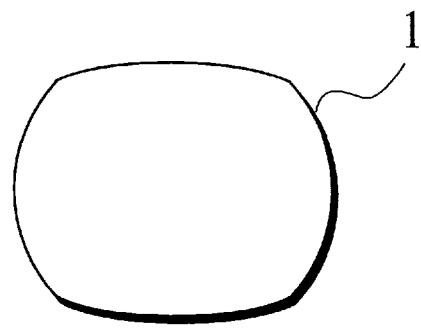
FIG. 4C is a sectional view on the surface corresponding to the line III B—III B according to the variation example of the annealing tube shown in FIG. 4A.

FIG. 4C is a sectional view on the surface corresponding to the line III B—III B of FIG. 4A, as the variation of the annealing tube shown in FIG. 4A. The bottoms of the grooves 12 dented vertical to the axial direction of the annealing tube in the present invention may have the flat surfaces as shown in FIG. 4B or the curved surfaces as shown in FIG. 4C.

Figure 5A:
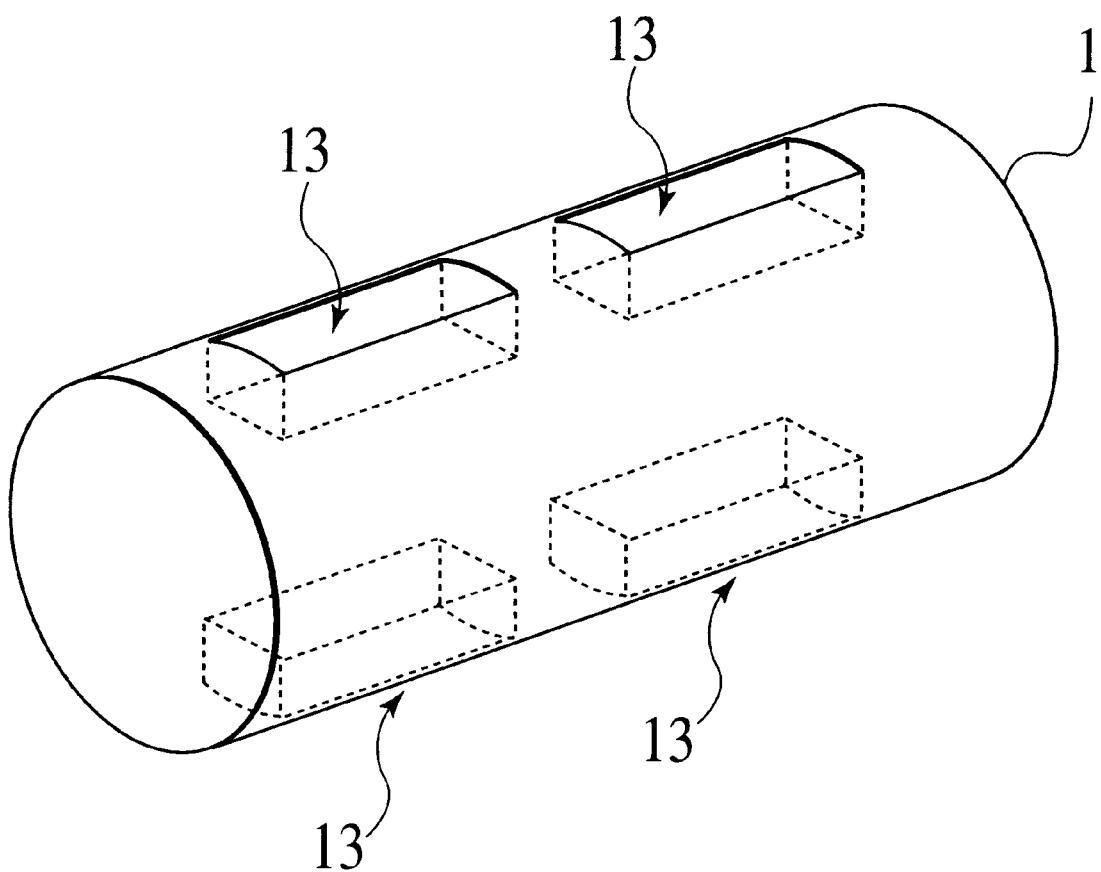
FIG. 5A is a perspective view (bird's eye view) of still another annealing tube according to the equipment for manufacturing a semiconductor device in the present invention.

FIG. 5A is a perspective view (bird's eye view) of still another annealing tube according to the equipment for manufacturing a semiconductor device in the present invention. In FIG. 5A, rectangular grooves 13 which have long sides along the axial direction of the annealing tube 1 are dented at the wall of the annealing tube 1. The IR lamps may be tailed into and plucked out from respective rectangular grooves 13 by using an IR lamp moving unit.

Figure 5B:
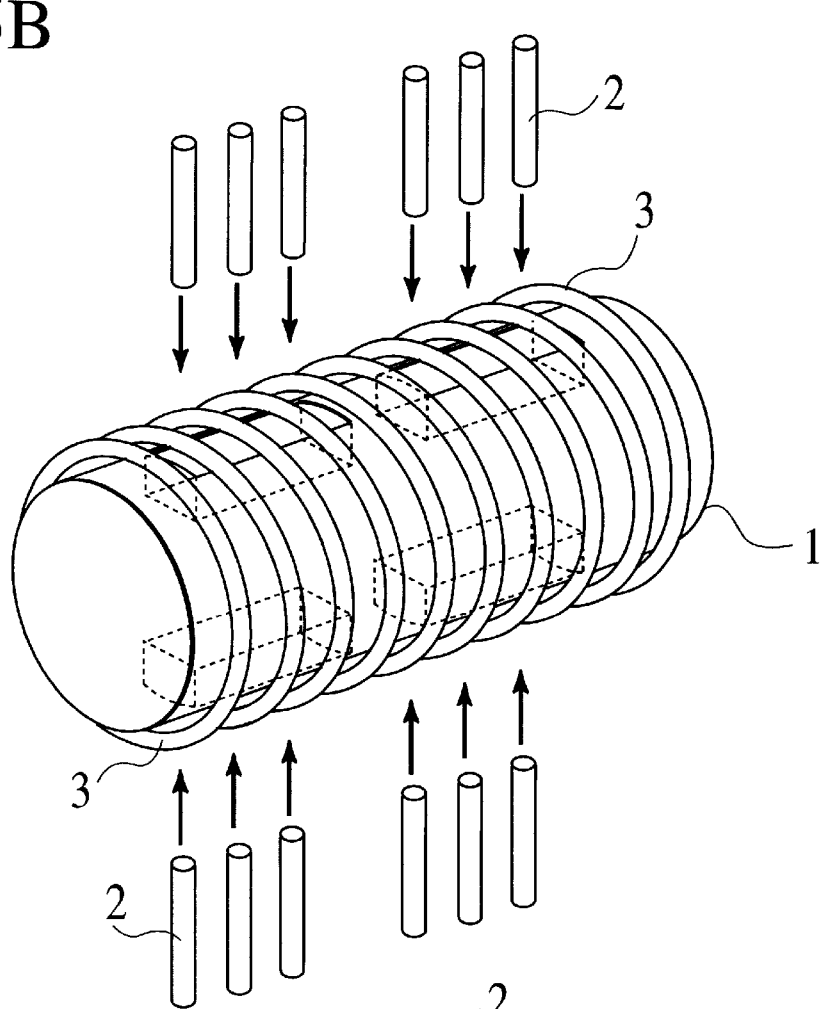
FIG. 5B is a perspective view (bird's eye view) of the equipment for manufacturing a semiconductor device in the present invention, in which the annealing tube shown in FIG. 5A is used.

FIG. 5B is a perspective view (bird's eye view) of the equipment for manufacturing a semiconductor device in the present invention, in which the annealing tube 1 shown in FIG. 5A is used. The resistive heater (heating wire) 3 made of the refractory metal silicide and the like is wrapped around the high purity quartz tube 1 serving as the annealing tube. And, a plurality of cylindrical type IR lamps 2 are adapted so as to be tailed into and plucked out from the gaps of the wrapped heating wire 3.

In the equipment for manufacturing a semiconductor device in the present invention shown in FIG. 5B, after a plurality of wafers are placed on the wafer loader and this wafer loader is carried into the high purity quartz tube 1, the plurality of cylindrical type IR lamps 2 are respectively tailed into the rectangular grooves 13 of the high purity quartz tube 1. Then, the respective outputs of the inserted IR lamps 2 are increased, and the batch of wafers are heated up to the first annealing temperature $T_1$. After that, the first annealing step is executed in the period from the time point $t_2$ to the time point $t_3$ shown in FIG. 3. After the elapse of the time point $t_3$, the outputs of the respective IR lamps are reduced. Moreover, the IR lamps 2 begins to be gradually plucked out from the rectangular groove 13 of the high purity quartz tube 1. At the same time, the output power of the resistive heater 3 is increased, and the second annealing step is executed at the second annealing temperature $T_2$.

Figure 5C:
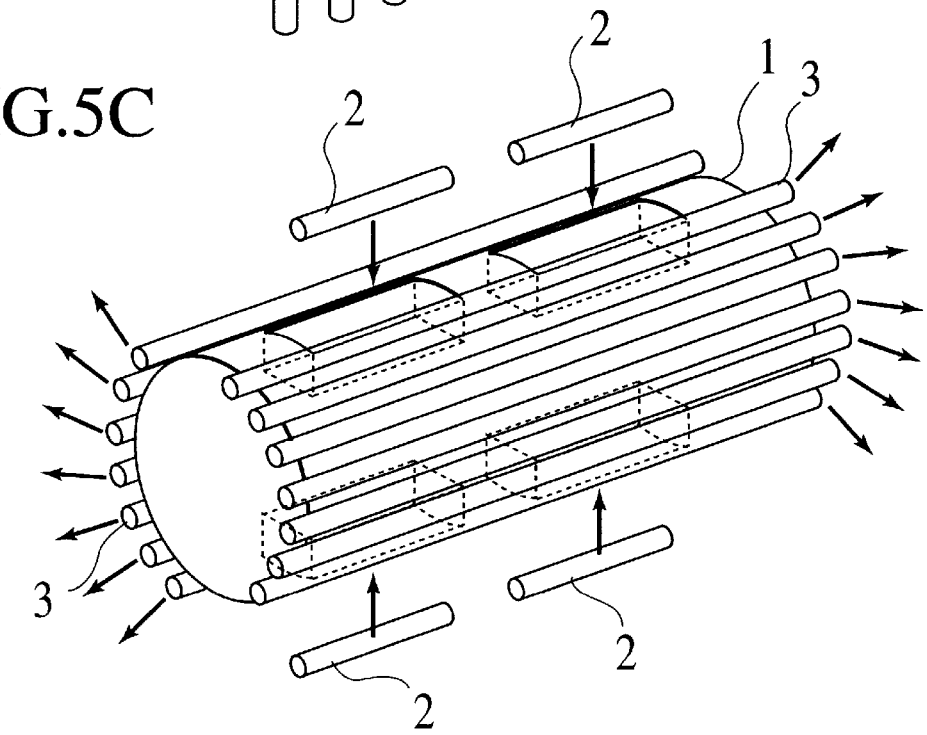
FIG. 5C is a perspective view (bird's eye view) of another equipment for manufacturing a semiconductor device in the present invention, in a case of using the annealing tube shown in FIG. 5A.

FIG. 5C is a perspective view (bird's eye view) of another equipment for manufacturing a semiconductor device in the present invention, in a case of using the annealing tube 1 shown in FIG. 5A. In FIG. 5C, a plurality of bar type resistive heaters (bar heating wires) 3 are arranged in parallel with the axial direction of the high purity quartz tube 1 serving as the annealing tube. The plurality of cylindrical type IR lamps 2 are arranged in parallel such that the axes are located along the axial direction of the high purity quartz tube 1, in the gaps between the plurality of the bar heating wires 3 arranged parallel to each other. The movement of the plurality of cylindrical type IR lamps 2 are controlled so as to be tailed into and plucked out from the rectangular grooves 13 according to the time sequence. Moreover, in FIG. 5C, the plurality of bar heating wires 3 are constituted such that the distances from the high purity quartz tube 1 can be changed according to the time sequence.

In the equipment for manufacturing a semiconductor device in the present invention shown in FIG. 5C, the plurality of bar heating wires 3 are firstly placed away from the tube wall of the high purity quartz tube 1. After the plurality of wafers are placed on the wafer loader and then this wafer loader is inserted into the high purity quartz tube 1, the plurality of cylindrical type IR lamps 2 are respectively inserted into the rectangular grooves 13 of the high purity quartz tube 1. And, the respective output powers of the inserted IR lamps 2 are increased, and the batch of wafers are heated up to the first annealing temperature $T_1$. After that, the first annealing step is executed in the period from the time point $t_2$ to the time point $t_3$, as shown in FIG. 3. After the elapse of the time point $t_3$, the output powers of the respective IR lamps 2 are reduced. Moreover, each IR lamps 2 begins to be gradually pulled out from the rectangular groove 13 of the high purity quartz tube 1. At the same time, the plurality of bar heating wires 3 are moved closely to the tube wall of the high purity quartz tube 1, the output power of the bar heating wires 3 is increased, and the second annealing temperature $T_2$ is executed. In FIG. 5C, only four IR lamps 2 are disclosed for the convenience of illustration. Actually, any number of IR lamps can be placed on the basis of the diameter of the wafer, the number of wafers, the rated output power of the IR lamp and the like.

Moreover, another geometrical configuration of the groove such as the groove arranged obliquely to the axial direction of the high purity quartz tube 1 may be employed besides the structures shown in FIGS. 4A to 4C and FIGS. 5A to 5C.

EXAMPLE 1

Figure 3:
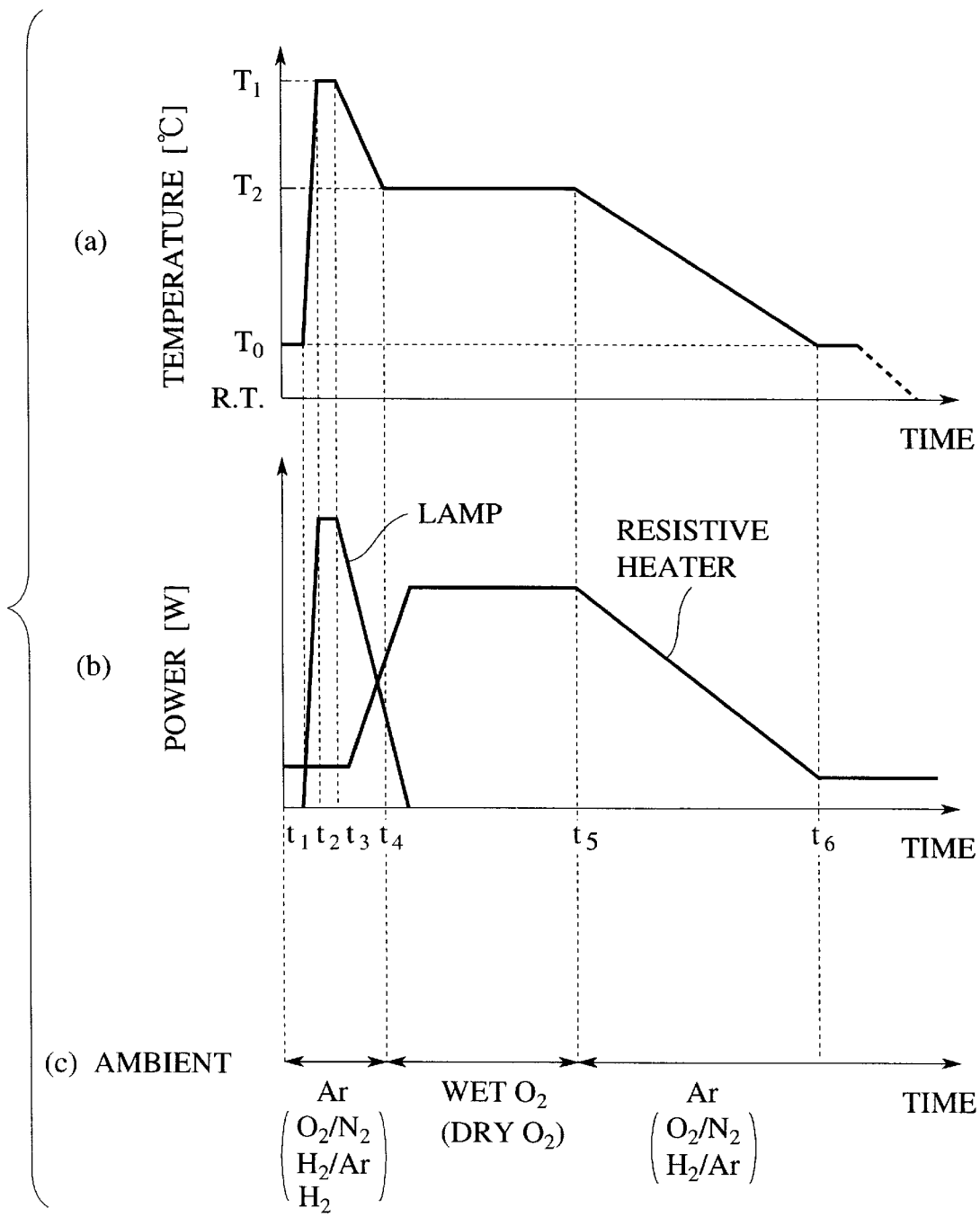
FIG. 3 is a schematic view showing the time dependencies of a temperature of a wafer, respective outputs of a resistive heater and an IR lamp, and various ambient gases in the annealing step in the present invention.

The case in which the sequence of annealing steps shown in FIG. 3 are used in a process of manufacturing the actual MOSFET will be described below as the EXAMPLE 1. In the EXAMPLE 1, the several processes among a sequence of fabrication process of the MOSFET, after the silicon wafer is prepared as the starting material up to the step of forming the gate insulating film having the thickness of 12 nm, is described.

(a) At first, a dopant ion, such as boron (B) ion, phosphorus (P) ion or arsenic (As) ion is implanted in order to form a channel stop region at and in the surface of the silicon wafer to suppress the generation of an inversion layer at the surface. In many cases, the dose amount is used in a range between $10^{11}$ and $10^{14}$ cm$^{-2}$, and the implantation energy is used in a range between 10 keV and 200 KeV. The ion implantation to form the channel stop region is executed through the silicon oxide film to avoid the contamination on the surface of the silicon wafer, the rough surface and the like, in many cases (hereafter, the silicon oxide film used for this purpose is referred to as "a dummy oxide film"). In this EXAMPLE 1, phosphorus (P) ion is implanted through the dummy oxide film having a thickness of 15 nm at implantation energy of 80 keV and doze of $5 \times 10^{13}$ cm$^{-2}$. After the implantation through the dummy oxide film having the thickness of 15 nm, this dummy oxide film is stripped by using ammonium fluoride (NH$_4$F) solution and the like.

(b) Then, after executing the step of removing the contaminants on the surface of the silicon wafers, the silicon wafers are carried into the heating furnace. In this EXAMPLE 1, the preheating temperature (the initial temperature) $T_0$ of the heating furnace is assumed to be 600° C. Then, in the IR lamp heating operation in a period from the time point ti (this time is defined as 0 minute) to the time point $t_2$ ($t_2=4$ seconds), the temperature of the silicon wafer is raised up to the first annealing temperature $T_1=1000°$ C. with the heating rate of 100° C. per second. And, it is assumed that the interval between the time point $t_2$ and the time point $t_3$ is 10 seconds.

(c) Then, from the time point $t_3$ to the time point $t_4$, the temperature of the silicon wafer is cooled down to the second annealing temperature $T_2=700°$ C. The cooling rate from the first annealing temperature $T_1=1000°$ C. to the second annealing temperature $T_2=700°$ C. is 50° C. per second ($t_4=20$ seconds). The argon (Ar) gas atmosphere (inactive ambient) is used as the ambient from the time point $t_1$ to the time point $t_4$.

(d) From the time point $t_4=20$ seconds, the Ar gas ambient is switched to the wet O$_2$ ambient (hydrogen burning), and the silicon oxide film having the thickness of 12 nm is formed under this condition until time point $t_5$. At the time point $t_5$, the wet O$_2$ ambient is switched to the Ar gas ambient. Then, the silicon wafer is cooled at the cooling rate of 50° C. per minute the second annealing temperature $T_2=700°$ C. to the initial temperature $T_0=600°$ C.

Figure 6:
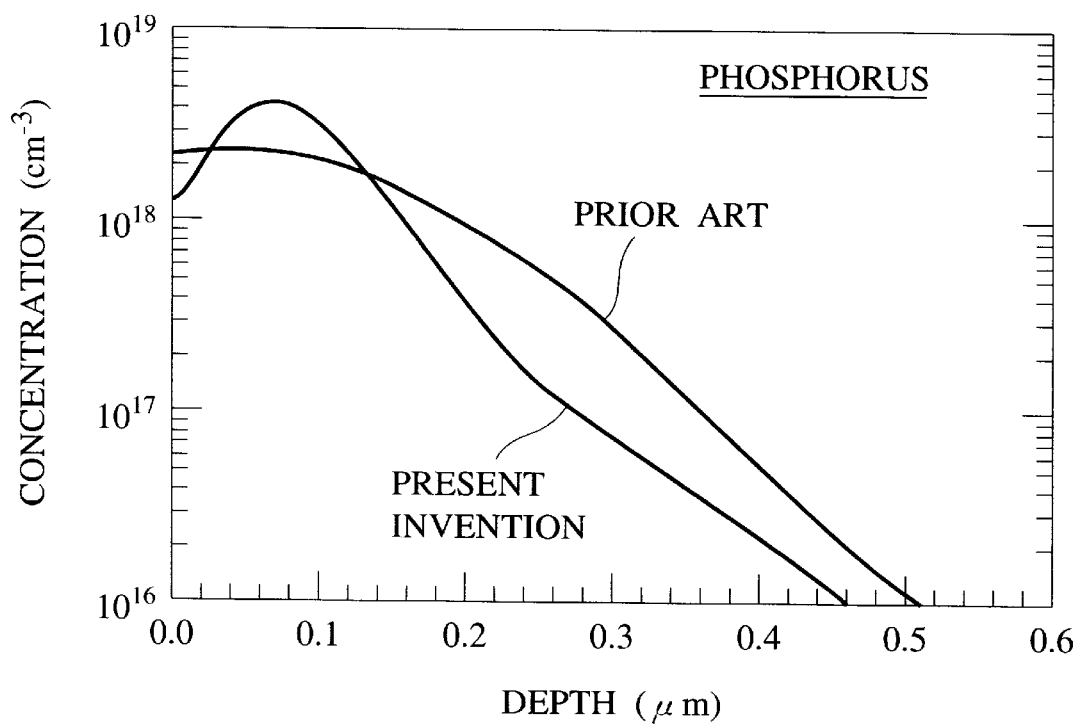
FIG. 6 is a view showing a phosphorus (P) concentration profile in a wafer when a gate insulating film is formed by an annealing step according to EXAMPLE 1 in the present invention.

FIG. 6 shows the phosphorus (P) concentration profile in the silicon wafer after the gate insulating film is formed in this annealing step. In FIG. 6, it is also included the phosphorus (P) concentration profile in the conventional case in which the preliminary treatment (RTA) before the oxidation step is not executed. From FIG. 6, it is understood that the implantation damage causes the large enhancement of the diffusion in the conventional case. On the contrary, in the method according to the present invention, it is understood that the rapid heating up step (100° C. per second) and the high temperature annealing (10 seconds) enable the implantation damage to be recovered and also suppress the enhanced diffusion of the phosphorus (P) and thereby attain the sharp concentration profile. In this EXAMPLE 1, the annealing step until the time point $t_4$ is executed under the Ar gas atmosphere. However, in the present invention, it is possible to use the oxygen (O$_2$) gas diluted with the nitrogen (N$_2$) gas , the hydrogen (H$_2$) gas diluted with the Ar gas and the like.

In the present invention, after the rapid heating up step and the high temperature annealing step, it is possible to successively execute the oxidizing step without lowering the temperature to the room temperature. Hence, it is possible to manufacture an excellent semiconductor device with little thermal fatigue and little micro defect without increasing the number of conventional fabrication steps.

EXAMPLE 2

In this EXAMPLE 2, another fabrication sequence of the actual MOSFET will be described as another example of the annealing steps shown in FIG. 3. Here, the case is explained in which a gate insulating film is formed after executing a high acceleration energy implantation to form deep diffusion regions of an n well, a p well and the like and executing a relatively low energy ion implantation to control an impurity concentration in the vicinity of a channel surface. Conventionally, the well diffusion region is formed by the thermal diffusion of a high temperature and a long hour drive-in annealing. In this regard, the very high acceleration energy implantation technology has a merit of enabling the impurity to be doped in a deep region at a short time. Recently, this very high acceleration energy implantation technology with a large projected range $R_p$ of implanted ion has been frequently used. However, the very high acceleration energy implantation causes many damages (point defects) to be induced in the substrate. Thus, the impurity diffusion is increased at the annealing step (for example, the gate insulating film step) after the very high acceleration energy implantation step, which results in a problem that the controllability of the impurity distribution becomes worse. And, the structural defect such as dislocation or the like is induced in the substrate, which results in a severe problem that the defect has bad influence on the electric performances such as junction leakage current and the like. Hence, it is important to recover the damage resulting from the very high acceleration energy implantation. The high temperature annealing is effective for the recovery of such a damage.

In this EXAMPLE 2, the fabrication process of the MOSFET up to form the gate insulating film on an n type silicon wafer, after the very high acceleration energy implantation, is explained.

(a) At first, boron (B) ion is implanted through the dummy oxide film having a film thickness of 20 nm into a silicon wafer at an acceleration energy of 100 keV with a dose amount of $1\times10^{13}$cm$^{-2}$. Next, phosphorus (P) ion is implanted at a very high acceleration energy of 750 keV with a dose amount $3\times10^{13}$cm$^{-2}$ to form the n type well. After these ion implantations, the dummy oxide film is stripped.

(b) Then, the oxidizing step is executed at 700° C. in the wet $O_2$ ambient for 30 minutes in order to form the gate insulating film on the silicon wafer surface. The feature of the present invention lies in the annealing manner at this step of the gate insulating film formation. Then, this manner is described with reference to FIG. 3. At first, the silicon wafer is carried into the annealing tube in which the preheating temperature $T_0$ is set to 600° C. The silicon wafer is heated up from a time point $t_1$ (defined as 0 second) to 1050° C. ($T_1$) at a heating rate of 50° C. per second ($t_2$=9 seconds).

(c) After maintained at 1050° C. for 10 seconds ($t_3$=19 seconds), the silicon wafer is cooled down to 700° C. ($T_2$) at a cooling rate of 50° C. per second ($t_4$=26 seconds). The Ar gas is used as the ambient within the annealing tube until this step ($t_4$). When the silicon wafer reaches 700° C. at a temperature $T_4$, the Ar gas ambient within the furnace is switched to the wet $O_2$ ambient. The temperature is maintained at 700° C. by the resistive heater, and the oxidizing operation is executed for 30 minutes ($t_5$=30 minutes 26 seconds).

(d) After that, the wet $O_2$ ambient is switched to $N_2$ atmosphere. The silicon wafer is cooled down to 600° C. at a cooling rate of 50° C. per minute ($t_6$=32 minutes 26 seconds). Then, the silicon wafer is taken out from the annealing tube.

Figure 7A:
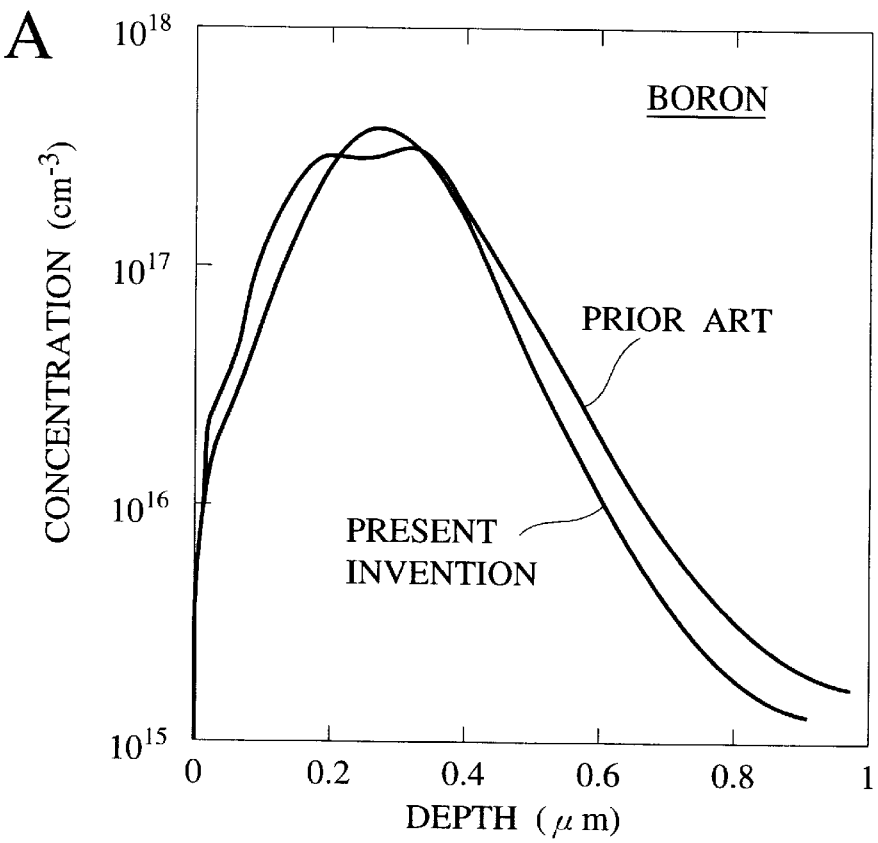
FIG. 7A is a view showing a boron (B) concentration profile in a wafer when a gate insulating film is formed by an annealing step according to EXAMPLE 2 in the present invention.
Figure 7B:
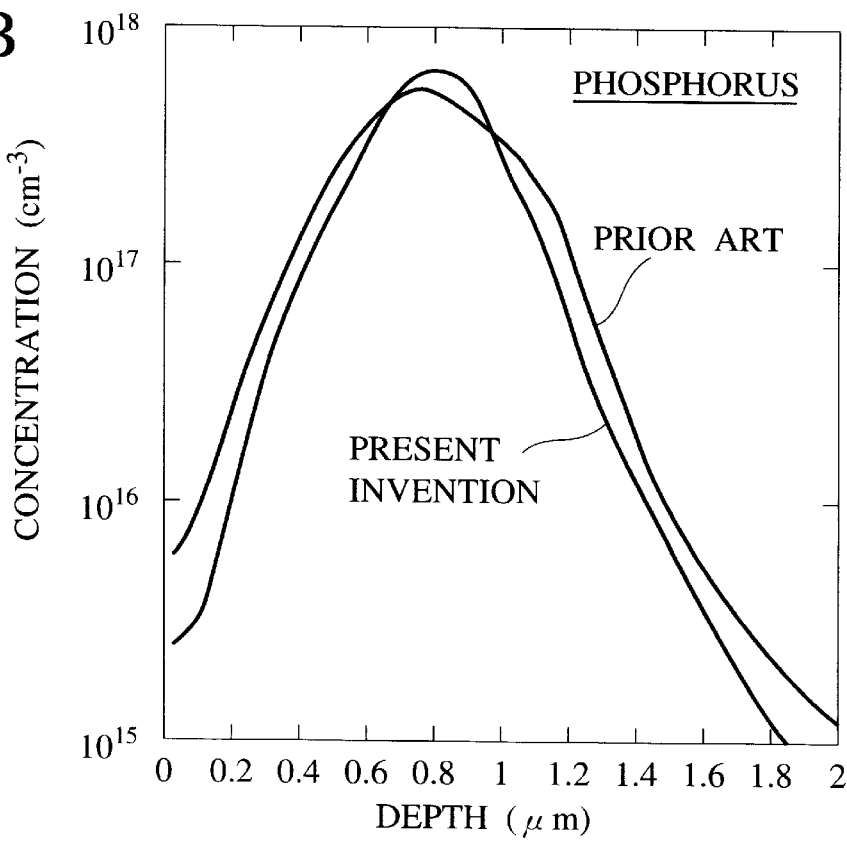
FIG. 7B is a view showing a phosphorus (P) concentration profile.

FIG. 7A show of the concentration profile of the boron (B) in the silicon wafer by the oxidizing method of EXAMPLE 2, namely, heating the silicon wafer up to 700° C. at a heating rate of 50° C. per minute, oxidizing in the wet $O_2$ ambient for 30 minutes and then cooling down to 600° C. at a cooling rate of 50° C. per minute. And FIG. 7B show the phosphorus (P) concentration profile in the silicon wafer by the oxidizing method of EXAMPLE 2. In FIGS. 7A and 7B, also included the boron (B) and the phosphorus (P) concentration profiles executed by the conventional annealing step. As can be seen from FIGS. 7A and 7B, in the annealing method of the EXAMPLE 2, it is understood that the diffusion depths of the boron (B) and the phosphorus (P) are shallow, although the high temperature RTA step of 1050° C. and 10 seconds is additionally contained as compared with the conventional method. This implies that the point defect resulting from the very high acceleration energy implantation is extinguished by the two step annealing comprising the RTA step prior to the oxidizing step according to the present invention. Hence, it can be understood that the present invention is effective for the recovery of the damage resulting from the very high acceleration energy implantation.

EXAMPLE 3

Figure 8:
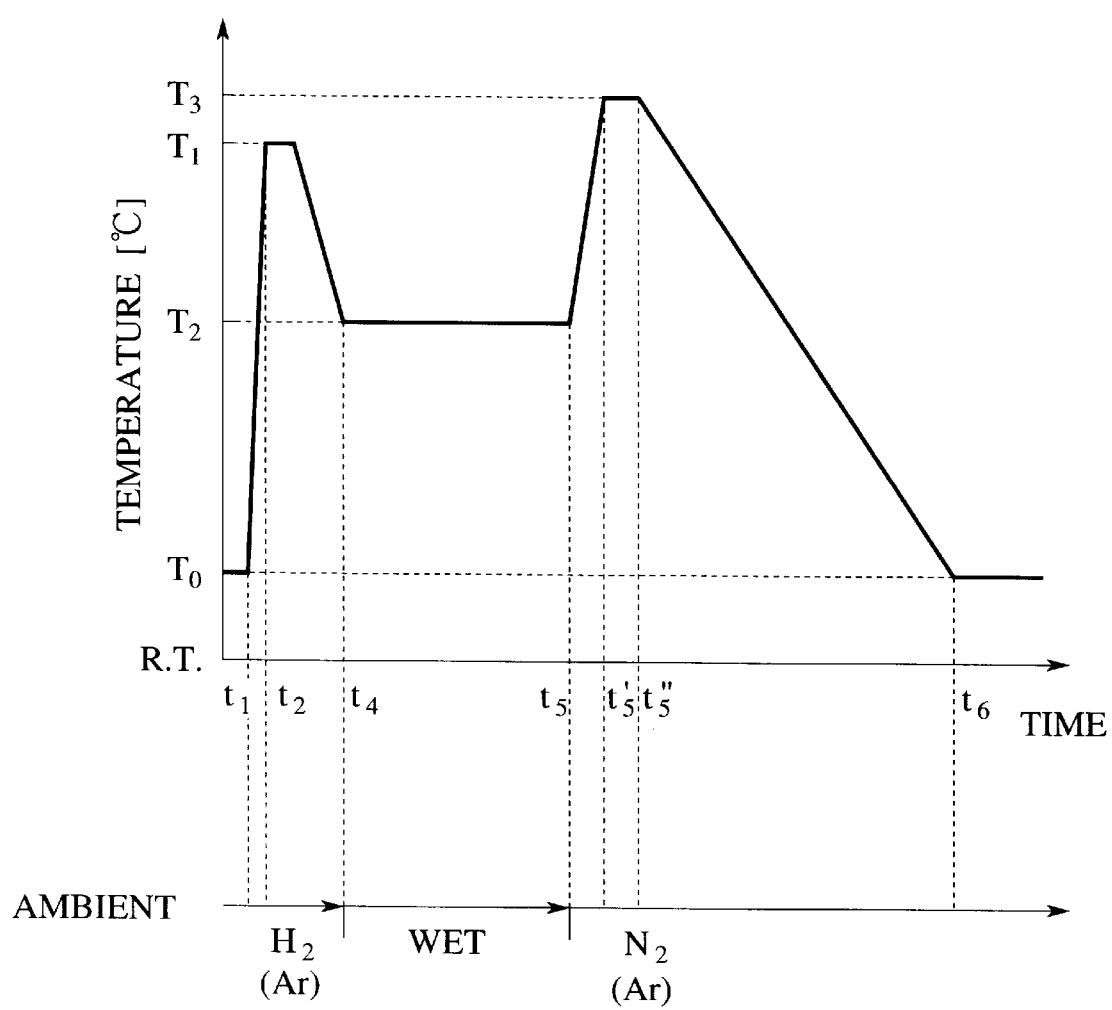
FIG. 8 is a schematic view explaining the time dependency of a temperature within a heating furnace in an annealing step according to EXAMPLE 3 in the present invention.

An EXAMPLE 3 will be described below with reference to FIG. 8.

In this EXAMPLE 3, an annealing method is explained which includes a third annealing step, namely, a heating up step, at a third annealing temperature $T_3$ between the second annealing step at the second annealing temperature $T_2$ of FIG. 3 and the cooling down step after the time point $t_5$. Especially if the second annealing step at the annealing temperature $T_2$ of FIG. 3 includes the oxidizing step, this annealing method is effective in improving the film quality of the silicon oxide film formed by this oxidizing step. In particular, in a case of the semiconductor device such as the MOSFET and the like used in a semiconductor integrated circuit, the film thickness of the silicon oxide film serving as the gate insulating film has becoming thinner and thinner in recent years. The oxidation temperature tends to be lower in order to form such a very thin silicon oxide film. However, the structural stress, such as the lattice distortion remaining in the network of silicon atoms and oxygen atoms, remains in the film oxidized at a low temperature. This causes the reliability of the silicon oxide film with regard to the breakdown voltages, the dielectric breakdown and the like to be made worse. Such a stress induced in the silicon oxide film can be effectively relaxed by the third annealing step at the third annealing temperature $T_3$. FIG. 8 is a schematic view explaining the time dependency of the temperature within the heating furnace in the annealing step. Now, steps until a time point $t_5$ are equal to those of FIG. 3. However, steps after the time point $t_5$ are different in existence of a heating step as follows:

(a) The silicon wafer is heated up to the third annealing temperature $T_3$ in the heating up step between the time point $t_5$ and a time point $t_5'$. At this time, the third annealing temperature $T_3$ can be set to any temperature equal to or higher than the second annealing temperature $T_2$. However, the temperature $T_3$ is desirable to be equal to or higher than 950° C. if it is targeted to improve the quality of the silicon oxide film. FIG. 8 shows the case in which the third annealing temperature $T_3$ is higher than the first annealing temperature $T_1$. However, it is possible to freely set the first annealing temperature $T_1$ and the third annealing temperature $T_3$ independently of each other. Moreover, it is also possible to freely set the heating rate. However, the heating rate equal to or higher than 50° C. per minute is desirable in order to suppress the extra impurity diffusion.

(b) The period from the time point $t_5'$ to a time point $t_5''$ is the maintaining time at the third annealing temperature $T_3$. However, this period may be zero, or it may be freely set. Also, the ambient can be freely set. Thus, it is allowable to use non-oxidative ambient such as $N_2$ gas, $H_2$ gas, Ar gas and the like, or oxidative ambient such as dry $O_2$, water vapor ($H_2O$) and the like.

(c) The period from the time point $t_5''$ to a time point $t_6$ is a cooling down step. This may be executed similarly to that in the period from the time point $t_5$ to the time point $t_6$ in the case of FIG. 3.

FABRICATION OF CMOS INTEGRATED CIRCUIT

Figure 9A:
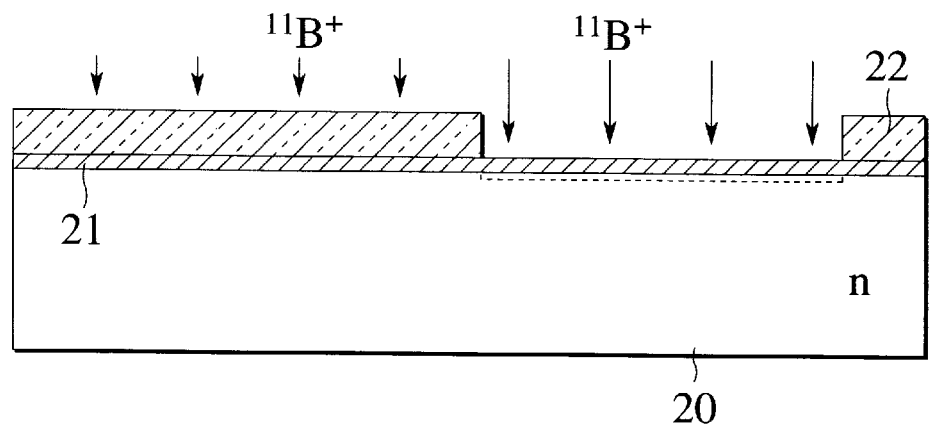
FIGS. 9A to 9N are sectional views at respective steps of manufacturing a CMOS integrated circuit to which the present invention is applied.
Figure 9B:
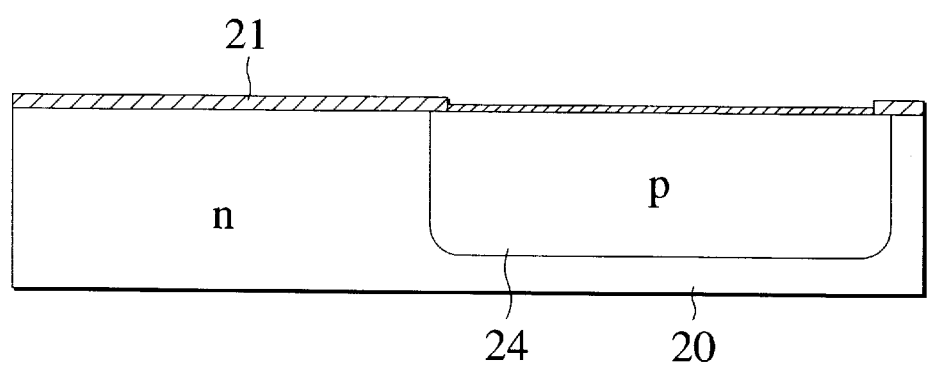

A fabrication process of a semiconductor integrated circuit with a CMOS structure used for a memory device and a logic device will be described below with reference to FIGS. 9A to 9N, and how the annealing step in the present invention is applied to this fabrication process will be described below.

(a) A semiconductor substrate 20, which is an n type silicon wafer with a main surface of a plane (100) having a resistivity of about 2 to 3 Ωcm, is prepared. After a thermal oxidation to provide a silicon oxide film ($SiO_2$ film) 21 of about 150 nm on the main surface of the semiconductor substrate 20, a photoresist film 22 is coated as shown in FIG. 9A. The photoresist film 22 is delineated by a photolithography technique to open a window for a p well formation region. Then, the boron (B) ion is implanted through the thermally grown oxide film 21 to the p well formation region at a dose amount of about $10^{12}$ to $10^{13}$ cm$^{-2}$. Next, the portion of the well formation region of 35 the thermally grown oxide film 21 is removed by etching. The photoresist film 22 is also removed. After a predetermined cleaning step is ended, the implanted boron is thermally diffused at about 1200° C. to form a p well 24 as shown in FIG. 9B.

Figure 9C:
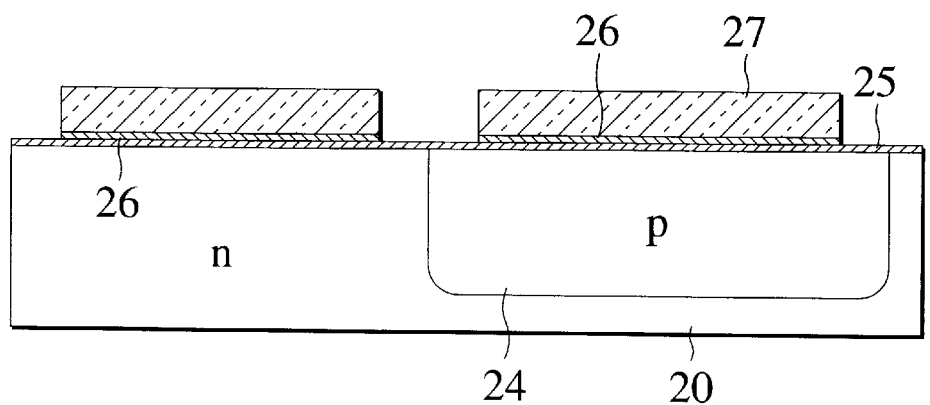

(b) After the thermally grown silicon oxide film 21 on the main surface of the semiconductor substrate 20 is entirely removed, a thermally grown silicon oxide film ($SiO_2$ film) 25 having a film thickness of about 100 nm is again formed on the main surface of the semiconductor substrate 20 as shown in FIG. 9C. After that, a silicon nitride film ($Si_3N_4$ film) 26 having a film thickness of about 200 nm is deposited by using a CVD (Chemical Vapor Deposition) method. A photoresist film 27 delineated by the photolithography technique is formed on this silicon nitride film 26. Reactive ion etching (RIE) is executed by using this photoresist film 27 as a mask. Accordingly, the silicon nitride film 26 formed for formation of an element isolation region is removed as shown in FIG. 9C. This step enables an element formation region (an active area) and an element isolation region to be partitioned. At this time point, the active area is covered by the silicon nitride film 26. After that, the photoresist film 27 used for delineating the silicon nitride film 26 is removed.

Figure 9D:
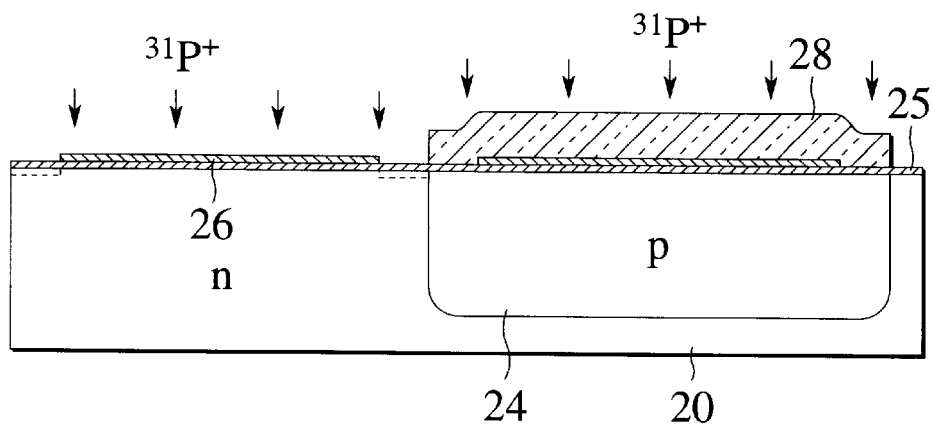
Figure 9E:
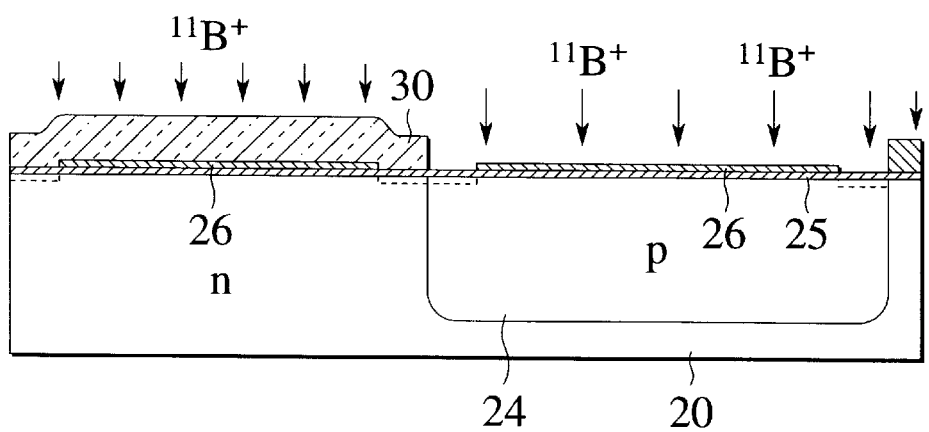

(c) Next, channel-stop impurity ions for suppressing the generation of inversion layers at the surface of n-substrate and the p-well is ion-implanted. When the channel-stop impurity ions are implanted into the element isolation regions, it is necessary that this impurity does not enter the active area. At first, as shown in FIG. 9D, the p well 24 and the silicon nitride film 26 thereon are covered with the photoresist film 28 by using the photolithography technique, and the phosphorus (P) ion is implanted. After the photoresist film 28 is removed, a new photoresist film 30 is formed on the region except the p well 24 by using the photolithography technique, as shown in FIG. 9E. Then, the boron (B) ion is implanted. After that, the photoresist film 30 is removed.

Figure 9F:
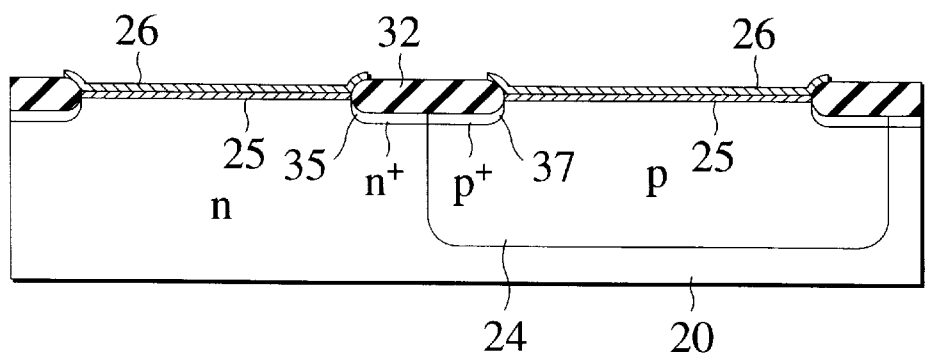

(d) A field oxide film 32 is formed on the element isolation region by using an LOCOS method. The field oxide film 32 has a film thickness of about 1 μm which is thicker by approximately one digit than that of the thermally grown oxide film such as the gate insulating film and the like. Thus, normally, the field oxide film 32 is grown by the thermally oxidization method with the wet $O_2$ ambient containing the water vapor having a high oxidizing rate. The silicon nitride film ($Si_3N_4$ film) 26 covering the active area is used as an oxidation protection film, because the oxidizing rate of the $Si_3N_4$ film 26 is extremely lower than that of silicon. As shown in FIG. 9F, in a boundary between the field oxide film 32 and the semiconductor substrate 20, a $p^+$ inversion protection layer (a channel stop region) is formed at the surface of and in the p well 24, and an $n^+$ inversion protection layer (a channel stop region) is formed at the surface of and in the substrate region.

Figure 9G:
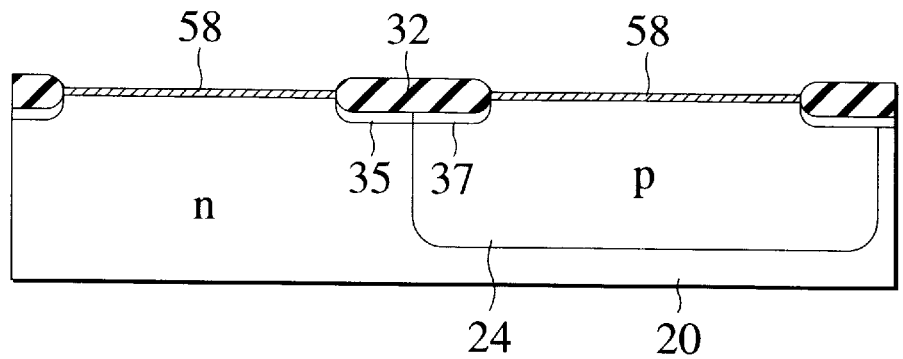
Figure 9H:
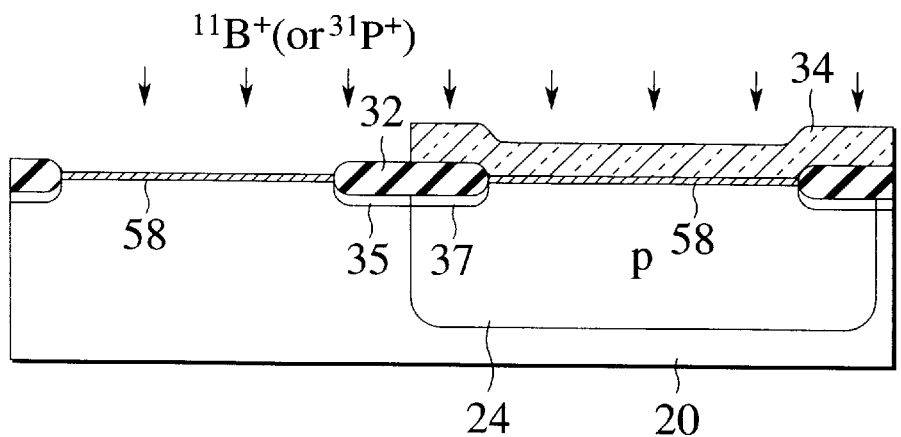
Figure 9I:
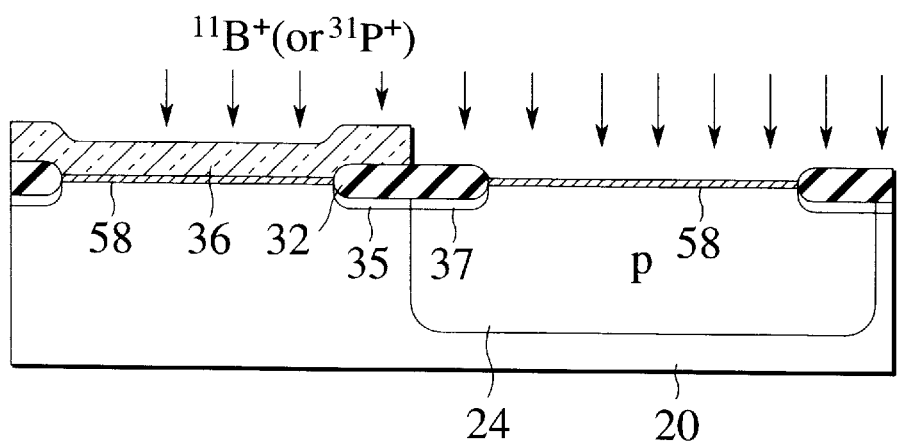

(e) As shown in FIG. 9G, after the thermally grown oxide film 25 and the $Si_3N_4$ film 26 thereon are removed, a dummy oxide film 58 having a film thickness of several tens of nanometers is formed on the active area. Next, a gate threshold voltage control ($V_{th}$ control) implantation is executed. At first, the p well 24 is covered by a photoresist film 34 by using the photolithography technique as shown in FIG. 9H, and the impurity ions for a gate threshold voltage control against the pMOSFET are implanted. After the photoresist film 34 is removed, as shown in FIG. 9I, a photoresist film 36 is coated on the region except on the surface of the p well 24 by using the photolithography technique. Successively, the impurity ions for the gate threshold voltage control against the nMOSFET are implanted. After that, the photoresist film 36 is removed. Moreover, the silicon oxide film 58 used as the dummy oxide film at the time of the $V_{th}$ control implantations is stripped.

Figure 9J:
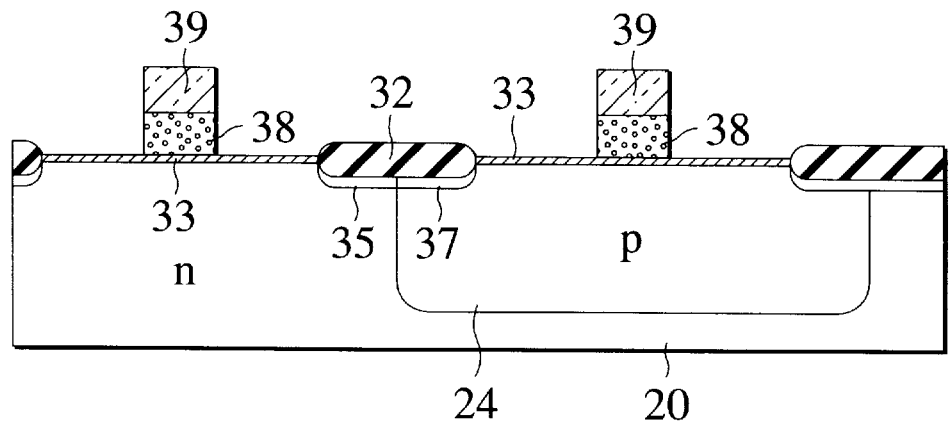

(f) Then, a new gate insulating film 33 is formed by executing another thermal oxidation as shown in FIG. 9J, after the predetermined preliminary treatment for the thermal oxidation. The sequence of annealing steps in the present invention is applied to the step of executing this thermal oxidation. That is, after the above mentioned execution of the $V_{th}$ control implantation and the strip of the thermally grown oxide film (dummy oxide film) as well as the predetermined preliminary treatment, the sequence of annealing steps shown in FIG. 3 is performed on this semiconductor substrate 20 to thereby form the gate insulating film 33. Then, a poly-silicon film having a thickness of about 400 nm is deposited on the whole surface of the gate insulating film 33 by using the CVD method. A photoresist film 39 patterned by the photolithography technique is formed on the poly-silicon film. And, with this photoresist film 39 as a mask, the poly-silicon film is etched by the reactive ion etching (RIE) and the like as shown in FIG. 9J, and a gate electrode 38 and a poly-silicon wiring (not shown) are formed. After that, the photoresist film 39 is removed.

Figure 9K:
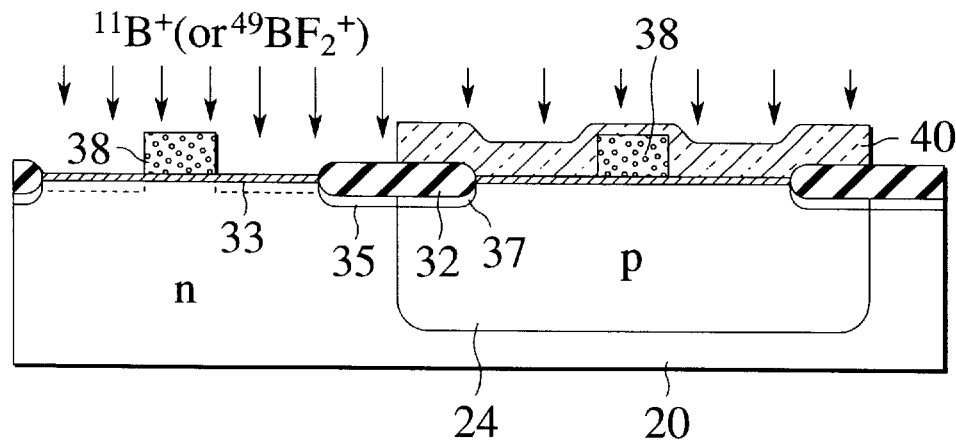
Figure 9L:
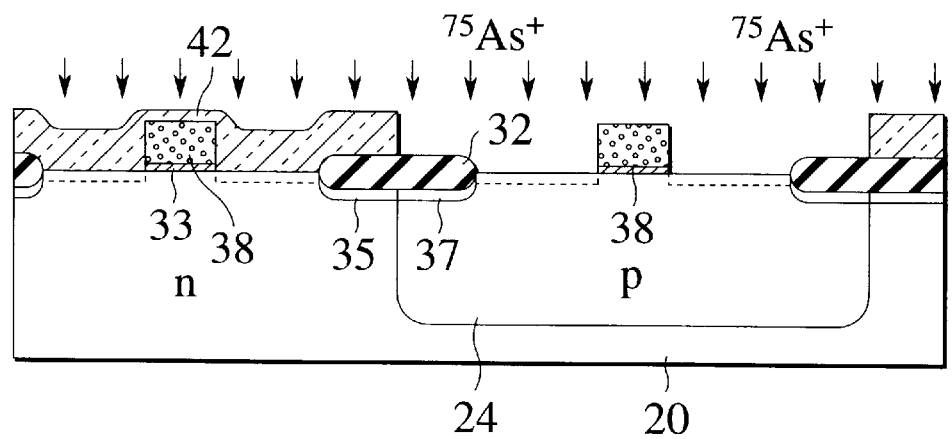

(g) A source/drain region is formed in the semiconductor 20. At first, a new photoresist film 40 is coated on the p well 24 and the gate electrode 38 thereon by using the photolithography technique, as shown in FIG. 9K. With the poly-silicon gate electrode 38 as a mask, the boron (B) ion is implanted in self-alignment manner at an order of a dose amount of $10^{15}$ cm$^{-2}$. At this time, the boron (B) ion is also implanted into the poly-silicon gate electrode 38. After the photoresist film 40 is removed, another photoresist film 42 is coated on the region except on the surface of the p well 24 by using the photolithography technique, as shown in FIG. 9L. And, with the poly-silicon gate electrode 38 as a mask, the arsenic (As) ion is implanted in the self-alignment manner at an order of $10^{15}$ cm$^{-2}$. At this time, the arsenic (As) ion is also implanted into the poly-silicon gate electrode 38. After that, the photoresist film 42 is removed.

Figure 9M:
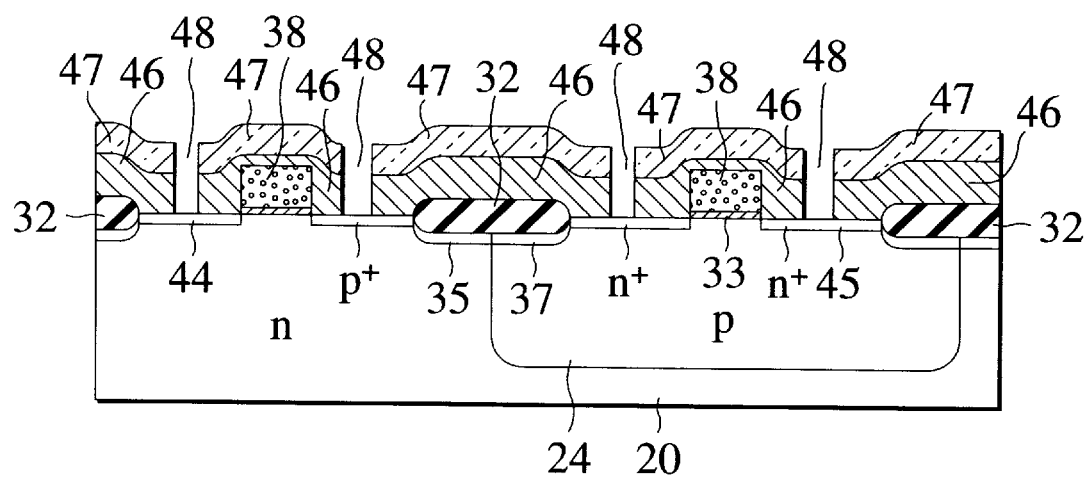
Figure 9N:
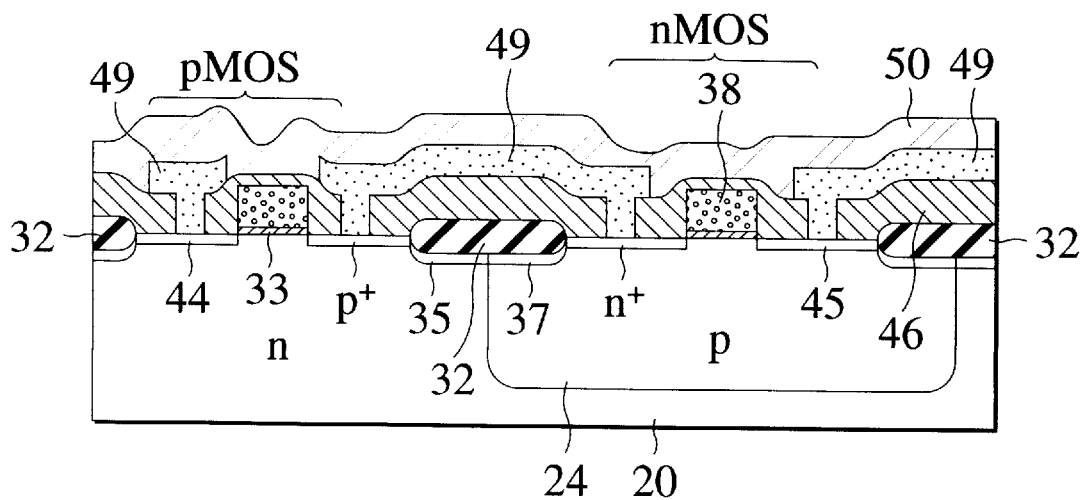

(h) The semiconductor substrate 20 is heated and processed, and the impurity is diffused. Then, n type source/drain regions are formed in the surface of and in the n type semiconductor substrate 20 and p type source/drain regions 44 are formed in the surface of and in the p well 24, as shown in FIG. 9M. At this time, the boron (B) ion and the arsenic (As) ion implanted into the poly-silicon gate electrodes 38 are also activated. Thus, the resistivities of both the poly-silicon gate electrodes 38 on the p MOSFET side and the n MOSFET side are made smaller, respectively. Next, interlayer insulating films 46 are deposited in order to insulate between the poly-silicon films constituting the gate electrode and the aluminum wiring layer connecting between the transistors, as shown in FIG. 9M. This interlayer insulating film 46 may be a composite film constituted by the two-layer structure of an silicon oxide film (CVD-$SiO_2$) having a film thickness of about 0.5 μm deposited by the CVD method and a BPSG (Boro-Phosphosilicate Glass) film or a PSG (Phosphosilicate Glass) film having a film thickness of about 0.5 μm deposited on this silicon oxide film (CVD-$SiO_2$) by the CVD method. The BPSG film located on the upper layer of this composite film is re-flowed to thereby smooth the surface of the interlayer insulating film 46. On this surface, a photoresist film 47 is delineated by the photolithography technique. Then, the interlayer insulating film 46 is etched to dig contact holes by using the RIE, the ECR ion etching and the like, employing the photoresist film 47 as a mask. Then, the contact holes 48 for connecting the aluminum wiring layer and the transistors are formed as shown in FIG. 9M. After that, the photoresist film 47 used to form these contact holes 48 is removed.

(i) An aluminum alloy film (Al—Si, Al—Cu—Si) containing silicon and the like is formed by using a spattering method, an electron beam (EB) vacuum evaporation method and the like. A mask for a photoresist film is formed on the aluminum alloy film by using the photolithography technique. This mask is used to pattern the aluminum alloy film (Al—Si, Al—Cu—Si) by using the RIE. Then, a metal wiring 49 which is electrically connected to the source/drain regions 44, 45 is formed as shown in FIG. 9N. After that, the photoresist film used to pattern this metal wiring 49 is removed. And, a passivation film 50, which targets to avoid the mechanical break and prevent the water and the impurity from permeating and has a film thickness of about 1 μm, is laminated on the metal wiring 49 by using the CVD method as shown in FIG. 9N. The PSG film, the $Si_3N_4$ film and the like are used for the passivation film 50.

As mentioned above, in this above fabrication steps, the present invention is applied to the sequence of steps comprising the $V_{th}$ control implantation → the strip of dummy oxide film → the thermal oxidation (the gate oxidation) → the poly-silicon CVD, for manufacturing the semiconductor integrated circuit with the CMOS structure. However, the present invention is not limited to these fabrication steps. It can be applied to any annealing step to improve and to stabilize the property of the silicon oxide film after the step, such as the ion implantation step, at which the semiconductor substrate may be damaged.

Various modifications will become possible for those skilled in the art after receiving the teachings of the present disclosure without departing from scope thereof. That is, as mentioned above, the method for manufacturing the semiconductor device according to the present invention is not limited to the above mentioned embodiments and it can be applied to various annealing steps.

What is claimed is:

1. A method for manufacturing a semiconductor device employing an equipment having an annealing tube, a resistive heater positioned adjacently to the annealing tube and IR (infrared) lamps positioned adjacently to the annealing tube and the resistive heater, the method comprising the steps of:

(a) heating a semiconductor substrate disposed in the annealing tube from an initial temperature up to a first annealing temperature at a first heating rate by increasing an input power for the IR lamps, while keeping an input power for the resistive heater in a low level such that a thermal energy emitted by the resistive heater is lower than that from the IR lamps so as not to contribute to the first annealing temperature, and then maintaining the first annealing temperature for a predetermined period, and thereby performing a first annealing on said semiconductor substrate;

(b) decreasing temperature of said semiconductor substrate from said first annealing temperature to a second annealing temperature, which is higher than said initial temperature and lower than said first annealing temperature, at a first cooling rate by decreasing the input power for the IR lamps, while increasing the input power for the resistive heater so as to attain the second annealing temperature;

(c) maintaining said second annealing temperature for a predetermined period and thereby performing a second annealing on said semiconductor substrate by controlling the input power for the resistive heater; and (d) cooling said semiconductor substrate at a second cooling rate by decreasing the input power for the resistive heater.

2. The method of claim 1, wherein a magnitude of said first cooling rate is lower than the magnitude of said first heating rate.

3. The method of claim 1, wherein a magnitude of said second cooling rate is lower than said first heating rate.

4. The method of claim 2, wherein a magnitude of said second cooling rate is lower than said first cooling rate.

5. The method of claim 1, wherein said initial temperature is equal to or higher than 500° C. and equal to or lower than 600° C.

6. The method of claim 1, wherein said first heating rate is equal to or higher than 10° C. per second.

7. The method of claim 1, wherein said first annealing temperature is equal to or higher than 950° C.

8. The method of claim 1, wherein said second annealing temperature is equal to or higher than 600° C. and equal to or lower than 950° C.

9. The method of claim 1, wherein a magnitude of said second cooling rate is equal to or lower than 500° C. per minute.

10. The method of claim 1, wherein a plurality of concave portions are formed at a wall of said annealing tube, and said IR lamps are movably inserted respectively into the concave portions before said step of heating said semiconductor substrate up to the first annealing temperature, and said IR lamps are pulled out from the concave portions before increasing the input power for the resistive heater so as to attain the second annealing temperature.

11. The method of claim 1, wherein said first annealing step is executed in an ambient containing inert gas and said second annealing step is executed in an oxidative ambient.

12. The method of claim 1, wherein said first annealing step is executed in an oxidative ambient containing hydrogen gas and said second annealing step is executed in the oxidative ambient.

13. The method of claim 1, wherein said first annealing step is executed in an ambient containing a reduction gas and said second annealing step is executed in the oxidative ambient.

14. The method of claim 1, wherein said second annealing step is executed in an oxidative ambient containing water vapor.

15. The method of claim 1, wherein a batch of said semiconductor substrates are disposed in the annealing tube.

16. The method of claim 1, wherein said IR lamps are moved toward neighborhood of said semiconductor substrate before said step of heating said semiconductor substrate up to the first annealing temperature, and said IR lamps are pulled out from neighborhood of said semiconductor substrate to keep a distance from said semiconductor substrate before increasing the input power for the resistive heater so as to attain the second annealing temperature.

17. A method for manufacturing a semiconductor device employing an equipment having an annealing tube, a resistive heater positioned adjacently to the annealing tube and IR lamps positioned adjacently to the annealing tube and the resistive heater, the method comprising the steps of:

(a) heating a semiconductor substrate disposed in the annealing tube from an initial temperature up to a first annealing temperature at a first heating rate by increasing an input power for the IR lamps, while keeping an input power for the resistive heater in a low level such that a thermal energy emitted by the resistive heater is lower than that from the IR lamps so as not to contribute to the first annealing temperature, and then maintaining the first annealing temperature for a predetermined period, and thereby performing a first annealing on said semiconductor substrate;

(b) decreasing temperature of said semiconductor substrate from said first annealing temperature to a second annealing temperature, which is higher than said initial temperature and lower than said first annealing temperature, at a first cooling rate by decreasing the input power for the IR lamps, while increasing the input power for the resistive heater so as to attain the second annealing temperature.

(c) maintaining said second annealing temperature for a predetermined period and thereby performing a second annealing on said semiconductor substrate by controlling the input power for the resistive heater; and (d) heating said semiconductor substrate up to a third annealing temperature higher than said second annealing temperature at a second heating rate by increasing the input power for the IR lamps, while keeping the input power for the resistive heater in the low level, and then maintaining this temperature for a predetermined period, and thereby performing a third annealing on said semiconductor substrate; and (e) cooling said semiconductor substrate at a second cooling rate down to said initial temperature by decreasing the input power for the IR lamps.

18. The method of claim 17, wherein a magnitude of said first cooling rate is lower than the magnitude of said first heating rate.

19. The method of claim 17, wherein a magnitude of a second heating rate is higher than the magnitude of said first cooling rate.

20. The method of claim 17, wherein a magnitude of said second cooling rate is lower than the magnitude of said first cooling rate.

21. The method of claim 17, wherein said third annealing temperature is higher than said second annealing temperature.

22. The method of claim 17, wherein a plurality of concave portions are formed at a wall of said annealing tube and said IR lamps are movably inserted respectively into the concave portions before said step of heating said semiconductor substrate up to the first annealing temperature, and said IR lamp are pulled out from the concave portions before increasing the input power for the resistive heater so as to attain the second annealing temperature.

23. The method of claim 22, wherein said lamps are movably inserted respectively into the concave portions before said step of heating said semiconductor substrate up to the third annealing temperature.

24. The method of claim 17, wherein a batch of said semiconductor substrates are disposed in the annealing tube.

25. The method of claim 17, wherein said IR lamps are moved toward neighborhood of said semiconductor substrate before said step of heating said semiconductor substrate up to the first annealing temperature, and said IR lamps are pulled out from neighborhood of said semiconductor substrate to keep a distance from said semiconductor substrate before increasing the input power for the resistive heater so as to attain the second annealing temperature.

26. The method of claim 25, wherein said IR lamps are moved toward neighborhood of said semiconductor substrate before said step of heating said semiconductor substrate up to the third annealing temperature.

* * * * *